(12) United States Patent
Pegna et al.

(10) Patent No.: US 12,006,605 B2
(45) Date of Patent: Jun. 11, 2024

(54) NON-WOVEN MICRO-TRELLIS FABRICS AND COMPOSITE OR HYBRID-COMPOSITE MATERIALS REINFORCED THEREWITH

(71) Applicant: FREE FORM FIBERS, LLC, Saratoga Springs, NY (US)

(72) Inventors: Joseph Pegna, Saratoga Springs, NY (US); Shay L. Harrison, East Schodack, NY (US); Erik G. Vaaler, Redwood City, CA (US); John L. Schneiter, Cohoes, NY (US)

(73) Assignee: Free Form Fibers, LLC, Saratoga Springs, NY (US)

( * ) Notice: Subject to any disclaimer, the term of this patent is extended or adjusted under 35 U.S.C. 154(b) by 0 days.

(21) Appl. No.: 16/938,072

(22) Filed: Jul. 24, 2020

(65) Prior Publication Data

US 2021/0087726 A1 Mar. 25, 2021

Related U.S. Application Data

(60) Provisional application No. 62/905,598, filed on Sep. 25, 2019.

(51) Int. Cl.
*D04H 1/74* (2006.01)
*D04H 1/4234* (2012.01)
(Continued)

(52) U.S. Cl.
CPC ............ *D04H 1/74* (2013.01); *D04H 1/4234* (2013.01); *D04H 1/4374* (2013.01); *D04H 1/43835* (2020.05); *D10B 2403/033* (2013.01)

(58) Field of Classification Search
CPC .... D04H 1/74; D04H 1/4234; D04H 1/43835; D04H 1/4374; D10B 2403/033
See application file for complete search history.

(56) References Cited

U.S. PATENT DOCUMENTS 3,062,683 A 11/1962 Kalleberg et al.
3,148,102 A 9/1964 Eakins et al.
(Continued)

FOREIGN PATENT DOCUMENTS

CN 103387230 A 11/2013
EP 1 209 123 A2 5/2002
(Continued)

OTHER PUBLICATIONS

Duty et al., "Z-pinning approach for 3D printing mechanically isotropic materials," Additive Manufacturing, vol. 27, pp. 175-184 (May 2019). (Year: 2019).*

(Continued)

*Primary Examiner* — Jeremy R Pierce
(74) *Attorney, Agent, or Firm* — Kevin P. Radigan, Esq.; Heslin Rothenberg Farley & Mesiti P.C.

(57) ABSTRACT

A non-woven fabric is provided which includes a three-dimensional array of fibers. The three-dimensional array of fibers includes an array of standing fibers extending perpendicular to a plane of the non-woven fabric and attached to a base substrate, where the base substrate is one or more of an expendable film substrate, a metal base substrate, or a mandrel substrate. Further, the three-dimensional array of fibers includes multiple layers of non-woven parallel fibers running parallel to the plane of the non-woven fiber in between the array of standing fibers in a defined pattern of fiber layer orientations. In implementation, the array of standing fibers are grown to extend from the base substrate using laser-assisted chemical vapor deposition (LCVD).

4 Claims, 32 Drawing Sheets

(51) Int. Cl.
*D04H 1/4374* (2012.01)
*D04H 1/4382* (2012.01)

(56) References Cited

U.S. PATENT DOCUMENTS

| | | | |
|---|---|---|---|
| 3,535,187 | A | 10/1970 | Wood |
| 3,755,061 | A | 8/1973 | Schurb |
| 3,958,406 | A | 5/1976 | Corbiere |
| 4,076,380 | A | 2/1978 | DiMarcello |
| 4,539,248 | A | 9/1985 | Brockington et al. |
| 4,588,699 | A | 5/1986 | Brennan et al. |
| 4,962,070 | A | 10/1990 | Sullivan |
| 5,094,804 | A | 3/1992 | Schweitzer |
| 5,096,739 | A | 3/1992 | Strutt et al. |
| 5,134,020 | A | 7/1992 | Cotteret et al. |
| 5,296,288 | A | 3/1994 | Kourtides et al. |
| 5,326,731 | A | 7/1994 | Bhola et al. |
| 5,342,022 | A | 8/1994 | Artjushenko et al. |
| 5,399,430 | A | 3/1995 | Nordine et al. |
| 5,705,122 | A | 1/1998 | Curran |
| 5,786,023 | A | 7/1998 | Maxwell et al. |
| 5,955,391 | A | 9/1999 | Kameda et al. |
| 6,183,714 | B1 | 2/2001 | Smalley et al. |
| 6,291,058 | B1 | 9/2001 | Goujard et al. |
| 6,322,889 | B1 | 11/2001 | Lara-Curzio et al. |
| 6,323,413 | B1 | 11/2001 | Roth et al. |
| 6,446,814 | B1 | 9/2002 | King |
| 6,706,400 | B2 | 3/2004 | Mercuri et al. |
| 7,657,142 | B2 | 2/2010 | Gasca et al. |
| 7,666,475 | B2 | 2/2010 | Morrison |
| 9,206,508 | B1 | 12/2015 | Hariharan et al. |
| 9,217,210 | B2 | 12/2015 | Velev et al. |
| 9,896,385 | B2 | 2/2018 | Harrison et al. |
| 9,938,393 | B2 | 4/2018 | Schneiter et al. |
| 10,676,391 | B2 | 6/2020 | Harrison et al. |
| 2002/0085968 | A1 | 7/2002 | Smalley |
| 2003/0168146 | A1* | 9/2003 | Wenstrup ............ D04H 11/00 442/411 |
| 2005/0048859 | A1 | 3/2005 | Canahan et al. |
| 2005/0082676 | A1 | 4/2005 | Andry et al. |
| 2005/0181192 | A1 | 8/2005 | Steffier |
| 2005/0247904 | A1 | 11/2005 | Raj et al. |
| 2005/0255033 | A1 | 11/2005 | Shimoji et al. |
| 2006/0039524 | A1 | 2/2006 | Feinroth et al. |
| 2006/0115648 | A1 | 6/2006 | Chen |
| 2007/0093587 | A1 | 4/2007 | Shen et al. |
| 2008/0143209 | A1 | 6/2008 | Tan et al. |
| 2008/0153959 | A1 | 6/2008 | Charati et al. |
| 2008/0175988 | A1 | 7/2008 | Chiu et al. |
| 2008/0237216 | A1 | 10/2008 | Goto |
| 2009/0064476 | A1 | 3/2009 | Cross et al. |
| 2010/0040834 | A1 | 2/2010 | Dawes et al. |
| 2010/0055352 | A1* | 3/2010 | Maxwell ............. B81C 99/0095 977/734 |
| 2011/0124483 | A1 | 5/2011 | Shah et al. |
| 2011/0170653 | A1 | 7/2011 | Cabrero et al. |
| 2011/0274906 | A1 | 11/2011 | Kim et al. |
| 2011/0286570 | A1 | 11/2011 | Farmer et al. |
| 2011/0311427 | A1 | 12/2011 | Hauge et al. |
| 2012/0002777 | A1 | 1/2012 | Lahoda et al. |
| 2012/0076718 | A1 | 3/2012 | Liu et al. |
| 2012/0135224 | A1 | 5/2012 | Guzman de Villoria et al. |
| 2012/0287553 | A1 | 11/2012 | Ramani et al. |
| 2012/0315467 | A1 | 12/2012 | Lafdi et al. |
| 2012/0315815 | A1 | 12/2012 | Fong et al. |
| 2013/0010915 | A1 | 1/2013 | Gamier et al. |
| 2013/0077731 | A1 | 3/2013 | Sherwood et al. |
| 2013/0093122 | A1 | 4/2013 | Schultz et al. |
| 2013/0163711 | A1 | 6/2013 | Zabiego et al. |
| 2013/0329849 | A1 | 12/2013 | Mazaudier |
| 2014/0170919 | A1 | 6/2014 | Manipatruni et al. |
| 2015/0004393 | A1* | 1/2015 | Pegna ............ C04B 35/62865 501/95.2 |
| 2016/0347672 | A1 | 12/2016 | Harrison |
| 2017/0213604 | A1 | 7/2017 | Pegna et al. |
| 2017/0326838 | A1 | 11/2017 | Pegna et al. |
| 2017/0331022 | A1 | 11/2017 | Pegna et al. |
| 2017/0369998 | A1 | 12/2017 | Pegna et al. |
| 2018/0057413 | A1 | 3/2018 | Lahoda |
| 2018/0087157 | A1 | 3/2018 | Harrison et al. |
| 2018/0087214 | A1 | 3/2018 | Harrison et al. |
| 2018/0148864 | A1 | 5/2018 | Harrison et al. |
| 2018/0154437 | A1 | 6/2018 | Mark |
| 2018/0370860 | A1 | 12/2018 | Pegna et al. |
| 2019/0047047 | A1* | 2/2019 | Mark ................... B33Y 70/00 |
| 2019/0062222 | A1 | 2/2019 | Pegna et al. |

FOREIGN PATENT DOCUMENTS

| | | |
|---|---|---|
| GB | 2054542 B | 1/1983 |
| JP | S 61-132628 A | 6/1986 |
| JP | H 03-285877 A | 12/1991 |
| JP | H 07-252662 A | 3/1995 |
| JP | H 09-268065 A | 10/1997 |
| JP | H 10-059780 A | 3/1998 |
| JP | 2002-211980 A | 7/2002 |
| JP | 2005-231952 A | 9/2005 |
| JP | 2013-210372 A | 10/2013 |
| WO | WO 1988/001204 A1 | 2/1988 |
| WO | WO 2010/090624 A1 | 8/2010 |
| WO | WO 2012/109841 A1 | 8/2012 |
| WO | WO 2012/129677 A1 | 10/2012 |
| WO | WO 2013/180764 A1 | 12/2013 |
| WO | WO 2014/143937 A1 | 9/2014 |
| WO | WO 2015/200257 A1 | 12/2015 |

OTHER PUBLICATIONS

Wallenberger et al., "Strong, Small Diameter, Boron Fibers by LCVD", Materials Letters, vol. 14 (1992), pp. 198-202.

Johansson et al., "Microfabrication of Three-Dimensional Boron Structures by Laser Chemical Processing", Journal of Applied Physics, vol. 72, No. 12, (1992), (8 pages).

Wallenberger, Frederick T., "Inorganic Fibres and Microfabricated Parts by Laser Assisted Chemical Vapour Deposition (LCVD): Structures and Properties*", Ceramics International, vol. 23, (1997), pp. 119-126.

Maxwell et al., "Real-Time Volumetric Growth Rate Measurements and Feedback Control of Three-Dimensional Laser Chemical Vapor Deposition", Appl. Phys. A, vol. 67, No. 3, (1998), pp. 323-329.

Waku et al., "An Amorphous Ceramic A132.4Er7.6O60 Fiber with Large Viscous Flow Deformation and a High-Strength Nanocrystallized Ceramic Fiber", Journal of Materials Science, vol. 36, No. 10, (May 2001), pp. 2435-2440.

Wen et al., "Interfacial Microstructure and Reaction of BN-Coated Single Crystal Al2O3 Fiber Reinforced NiAl Matrix Composites", Journal of Materials Science, vol. 37, No. 6, (Mar. 2002), pp. 1253-1258.

Kerans et al., "High Temperature Composites", Air Force Research Laboratory Report No. AFRL-ML-WP-TP-2002-407, (Aug. 2002), (22 pages).

Kerans et al., "Interface Design for Oxidation-Resistant Ceramic Composites", Journal of the American Ceramic Society, vol. 85, No. 11, (Nov. 2002), pp. 2599-2632.

Behlau et al., "Mechanical Properties of Carbon and BN Coated SiC Fibers", Ceramic Engineering and Science Proceedings, vol. 24, No. 4, (Jan. 2003), pp. 225-230.

Chen et al., "Carbide Derived Carbon (CDC) Coatings for Tyranno ZMI SiC Fibers", Ceramic Engineering and Science Proceedings, vol. 24, No. 3, (Jan. 2003), pp. 57-62.

Chen et al., "Carbothermal Synthesis of Al—O—N Coatings Increasing Strength of SiC Fibers", International Journal of Applied Ceramic Technology, vol. 1, No. 1, Jan. 1, 2004 (pp. 68-75).

Lee et al., "Microstructure and Mechanical Properties of Al2O3/Y3Al5O12/ZrO2 Ternary Eutectic Materials", Journal of European Ceramic Society, vol. 25, No. 8, (Jan. 2005), pp. 1411-1417.

Maxwell et al., "Preparation of Superhard BxCy Fibers by Microvortex-Flow Hyperbaric Laser Chemical Vapor Deposition", Diamond & Related Materials, vol. 16, Issue 8, (Jan. 2007), pp. 1557-1564.

(56) References Cited

OTHER PUBLICATIONS

Longtin et al., "Synthesis of Carbon Nanofiber Films and Nanofiber Composite Coatings by Laser-Assisted Catalytic Chemical Vapor Deposition", Thin Solid Films, vol. 515, No. 5, (2007) pp. 2958-2964.

Longtin et al., "Selective Area Synthesis of Aligned Carbon Nanofibers by Laser-Assisted Catalytic Chemical Vapor Deposition", Diamond & Related Materials, vol. 16 (2007) pp. 1541-1549.

Liao et al., "Large-Scale Aligned Silicon Carbonitride Nanotube Arrays: Synthesis, Characterization, and Field Emission Property", Journal of Applied Physics, vol. 101, No. 11, (Jun. 2007), pp. 114306.1-114306.4.

Hu et al., "Oxidation Behavior of Zirconium Diboride-Silicon Carbide at 1800°", Scripta Materialia, vol. 57, No. 9, (Nov. 2007), pp. 825-828.

Marsh, John, "Quantum Well Intermixing Revolutionizes High Power Laser Diodes", Diodenlaser, Laser Technik Journal, vol. 4, No. 5, DOI: 10.1002/latj.200790190 (Nov. 2007) (4 pages).

Liu et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, (Oct. 2008), pp. 3670-3672.

Jouanny et al., "Study of TiC Coatings on Nicalon Fibre Prepared by Pressure-Pulsed Reactive Chemical Vapour Deposition at Low Pressure", ECS Translations, vol. 25, No. 8, (Jan. 2009), pp. 1267-1272.

Roy et al., "Atomic Layer Deposition of Alumina Onto Carbon Fibers", Journal of the American Ceramic Society, vol. 94, No. 7, (Jul. 2011), pp. 2014-2022.

Zhang et al., "Ferromagnetism Induced by Intrinsic Defects and Boron Substitution in Single-Wall SiC Nanotubes", Journal of Physical Chemistry, vol. 115, No. 35, (Sep. 2011), pp. 9987-9992.

Gan, Yong X., "Structural Assessment of Nanocomposites", Micron, vol. 43, Issue 7, (2012) pp. 782-817.

Ares et al. "Columnar-to-Equiaxed Transition in Metal-Matrix Composites Reinforced with Silicon Carbide Particles", Hindawi Publishing Corporation, Journal of Metallurgy, vol. 2013, Article ID 628495, 12 pages.

Glazoff et al., "Morphological Analysis of Zirconium Nuclear Fuel Rods Braided with SiC: Quality Assurance and Defect Identification", Journal of Nuclear Materials, vol. 451, Issues 1-3, (Apr. 2014), pp. 216-224.

Wang, Mengxiao, M.S., "UV Laser-Assisted Diamond Deposition", The Graduate College at the University of Nebraska, (Nov. 2014), (100 pages), http://digitalcommons.uni.edu/cgi/viewcontent_cgi?article=1068&elecengtheses.

Luo et al., "Microstructure, Tensile Strength and Thermostability of W-core SiC Fibers With or Without Carbon Coating", Materials Science & Engineering: A, vol. 647, (2015), pp. 265-276.

Wang et al., "Synthesis of ZrC—SiC Powders from Hybrid Liquid Precursors with Improved Oxidation Resistance", Journal of the American Ceramic Society, vol. 98, No. 1, (Jan. 2015), pp. 197-204.

Jiang et al., "Fabrication of Barium-Strontium Aluminosilicate Coatings on C/SiC Composites via Laser Cladding", Journal of Materials Science & Technology, vol. 33, No. 2, (2017), pp. 166-171.

Zimmerman et al. "Fragmentation-Driven Grain Refinement in Directional Solidification of AlCu10wit-% Alloy at Low Pulling Speeds", Acta Materialia, vol. 126, (2017) pp. 236-250.

"International Preliminary Report on Patentability" for PCT Application No. PCT/US2020/043378, dated Apr. 7, 2022 (12 pages) (Year: 2022).

International Search Report & Written Opinion for PCT Application No. PCT/US2022/071965, dated Jul. 19, 2022 (9 pages) (Year: 2022).

\* cited by examiner

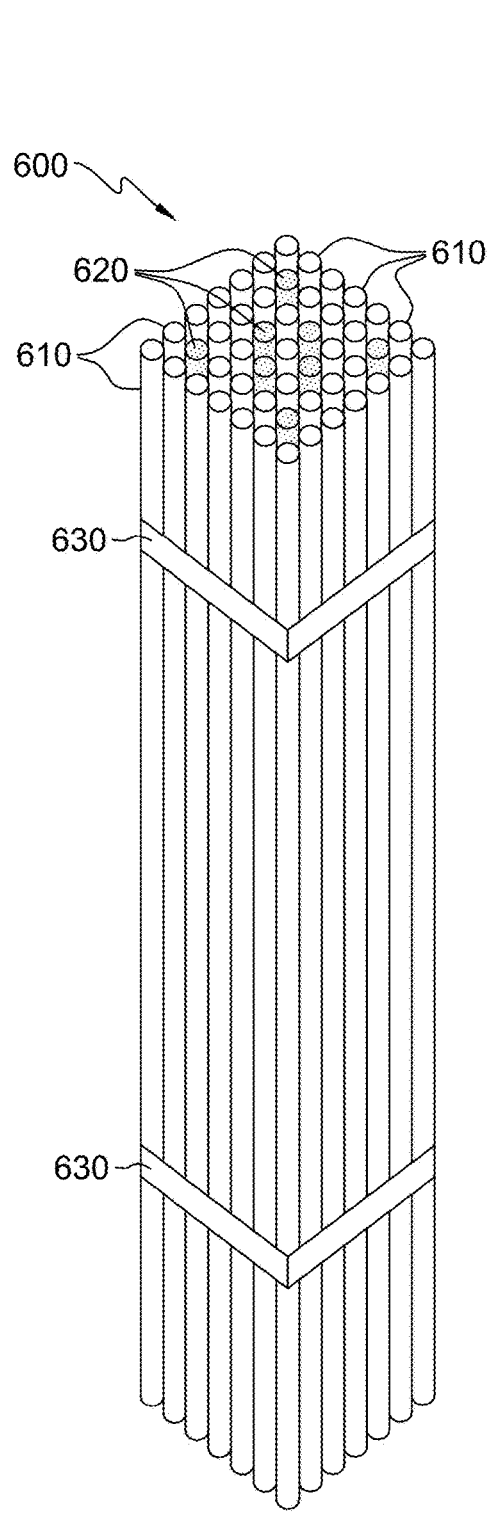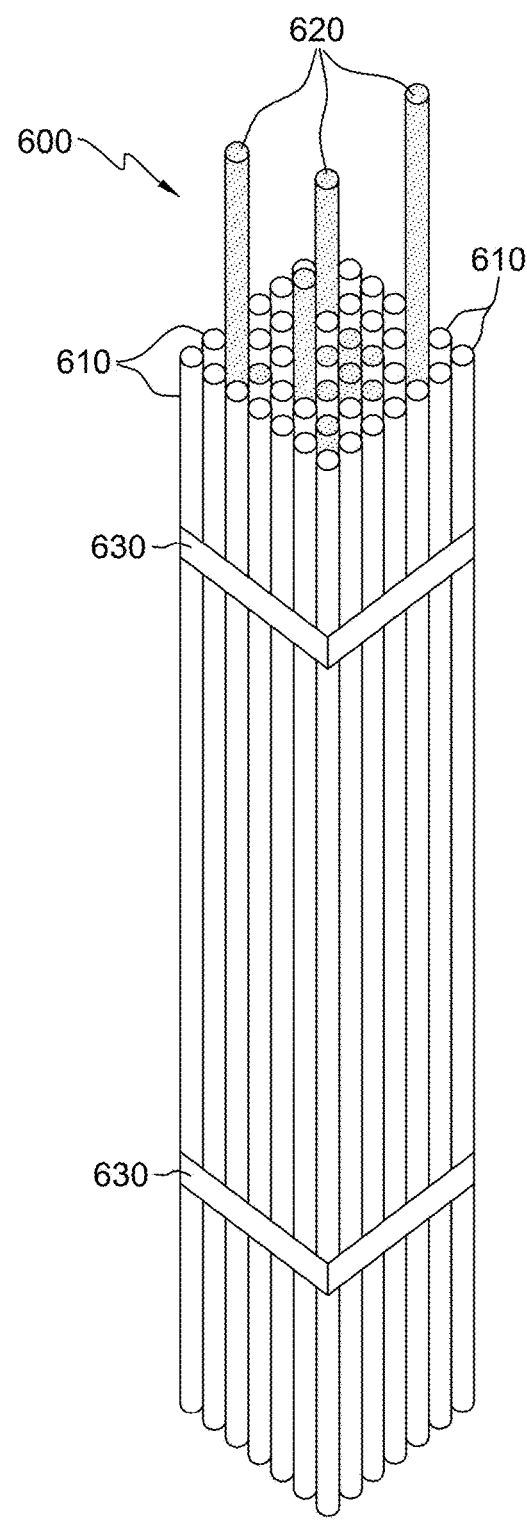
FIG. 6A
FIG. 6B

SQUARE LAYOUT

HEXAGONAL LAYOUT

Magnified view of corner with matrix removed showing square lattice micro-trellis Magnified view of corner with matrix removed showing hex lattice micro-trellis

NON-WOVEN MICRO-TRELLIS FABRICS AND COMPOSITE OR HYBRID-COMPOSITE MATERIALS REINFORCED THEREWITH

CROSS-REFERENCE TO RELATED APPLICATIONS

This application claims the benefit of U.S. provisional patent application Ser. No. 62/905,598, filed Sep. 25, 2019, entitled "Non-Woven Micro-Trellis Fabrics and Composite or Hybrid-Composite Materials Reinforce Therewith", which is hereby incorporated herein by reference in its entirety.

This application is also related to the following patent applications, each of which is hereby incorporated herein by reference in its entirety: US Patent Publication US 2018/0370860 A1, which published Dec. 27, 2018, entitled "Functional High-Performance Fiber Structure"; U.S. Pat. No. 10,047,015 B2, which issued on Aug. 14, 2018, entitled "High Strength Ceramic Fibers and Methods of Fabrication", and PCT Publication No. WO 2013/180764 A1, which published Dec. 5, 2013, entitled "High Strength Ceramic Fibers and Methods of Fabrication"; U.S. Pat. No. 10,546,661, which issued Jan. 28, 2020, entitled "Additive Manufacturing Technology for Placing Nuclear Reactor Fuel Within Fibers"; PCT Publication No. WO 2015/200257 A1, which published Dec. 30, 2015, entitled "An Additive Manufacturing Technology for the Fabrication and Characterization of Nuclear Reactor Fuel"; U.S. Patent Publication No. 2017/0331022 A1, which published Nov. 16, 2017, entitled "Multilayer Functional Fiber and Method of Making"; PCT Publication No. WO 2017/197105 A1, which published Nov. 16, 2017, entitled "Multilayer Functional Fiber and Method of Making"; U.S. Patent Publication No. 2017/326838 A1, which published Nov. 16, 2017, entitled "Fiber Delivery Assembly and Method of Making"; and PCT Publication No. WO 2017/197082 A1, which published Nov. 16, 2017, entitled "Fiber Delivery Assembly and Method of Making".

STATEMENT REGARDING GOVERNMENT RIGHTS

Certain aspects of this invention were made with United States Government support under a U.S. Department of Energy Award DE-SC0019912. Accordingly, the U.S. Government may have certain rights in this invention.

BACKGROUND

The present invention relates generally to the field of raw materials in fiber form, fibers for reinforcing materials, and more specifically to the field of printed fiber arrays for providing specific functionalities, such as, for example, 3-D reinforcement, integral joining of metals, carbon, ceramics or their composites, sensing, actuating, energy absorption, energy storage, robust fabrics, and/or combinations thereof.

SUMMARY

As described herein, fibers can be printed using laser induced chemical vapor deposition (LCVD) processes on a substrate, said substrate needs not be flat and may itself consists of a previously fabricated fiber structure fabricated according to the present invention. These fibers can be used in numerous applications including, but not limited to, 3-D reinforcement, sensing, actuating, energy absorption, energy storage, robust fabrics, and/or combinations thereof. Due to the additive manufacturing process of LCVD, the material of the fibers can be changed at any point in the process. Opportunities exist, therefore, to improve fibers grown on substrates, vary the material used, create new architectures and purposes for fibers, and join dissimilar materials by way of shared fiber architecture.

More particularly, weaving, braiding and knitting serve very important purposes in the construction of fabric articles. The process of weaving, however, becomes extremely damaging when fibers are abrasive and stiff, such as for example ceramic fibers. Damages imparted to fibers in the process of weaving may result in strength of the fabric being reduced by an order of magnitude or more. Moreover, any relative motion among fibers, such as is imparted during flexion of the fabric, will result in rapid wear of the fabric when fibers are made of an abrasive or hard material, such as for example Silicon Carbide.

Thick fabrics are especially appealing in the fabrication of composite materials, as they enhance productivity. When overlaying thick layers, however, the region in-between layers is subjected to shear stress in proportion to the layer thickness, leading to a well-known failure mode called "delamination."

Three dimensional weaves are particularly desirable to enhance load transfer across multiple fiber layers, however the highly curved warp that is necessary for 3-D weave is highly damaging to the fibers.

An alternative sometimes used to enhance load transfer between multiple layers of fabrics, is called Z-Pinning, in which thick fibers or needle like structures are forcibly stitched across all the layers that are desired to be joined. This process enhances resistance to delamination at the cost of many more damages to the constitutive fabrics.

The present invention addresses these shortcomings by providing in one aspect a fully three-dimensional fabric where fibers are not woven but instead form a 3-D network of fibers that do not need to interlace or interweave with each other, therefore preserving fiber strength. Fibers in this three-dimensional network are not forced against each other under an intraweave load. Fibers can maintain a clearance amongst themselves.

One aspect provides an array of short fibers running the thickness of the fabric or more, forming a functional equivalent of a very high density Z-pinning, but in accordance with the principles of the present invention.

Each layer of fiber running along the plane of the fabric may be, for example, exactly one fiber layer thick, the thinnest a layer can be.

The array of standing, or short, fibers running perpendicular to the fabric can be grown off a thin layer of expendable material, such as glass, off a layer intended to become part of the fabric, such as a tantalum foil, or directly off a mandrel (such as an airfoil or a tube) to directly form a finished CMC shell.

This novel fiber architecture is akin to a trellis structure at a microscale. Such a product presents multiple advantages when using stiff or abrading fibers.

Because fiber strength is well preserved, composite materials need less fibers for a given strength requirement, resulting in lighter composites.

Because composite shells can be made thinner, their thermal conductivity across the thickness is improved.

Thermal conductivity can be further enhanced by appropriate selection of constitutive materials for the standing fiber array running normal to the fabric.

Because fibers maintain a clearance amongst themselves, wear resistance of the resulting fabric is enhanced.

The very high density Z-Pinning provided by the standing fiber array running normal to the fabric provides for efficient load transfer from one layer of fabric to another, thus enhancing resistance to delamination.

Because each layer of fiber in the plane of the fabric is of the minimum thickness, interlaminar shear stress is also minimized.

In one aspect, anchoring the array of standing fibers into a substrate provides an innovative means of bonding dissimilar materials, such as metal, carbon, or ceramic to a ceramic matrix composite though what is essentially a high-density array of "micro-rivets".

Summarizing, the invention comprises, in one aspect, a non-woven fabric composed of a three dimensional array of fibers, wherein at least a portion of the fabric includes a square or hexagonal array of standing fibers running perpendicular to the plane of the fabric and attached to an expendable film, metallic foil, or mandrel substrate; and layers of non-woven parallel fibers running in the plane of the fabric in between said standing fibers in a 0-90 or a 0-60-120 orientation.

The array of standing fibers may comprise an ordinarily solid material selected from a group consisting of boron, carbon, aluminum, silicon, titanium, zirconium, niobium, molybdenum, hafnium, tantalum, tungsten, rhenium, yttrium, osmium, uranium, thorium, plutonium, nitrogen, oxygen, and combinations thereof.

The array of fibers running parallel to the plane of the fabric may comprise an ordinarily solid material selected from a group consisting of boron, carbon, aluminum, silicon, titanium, zirconium, niobium, molybdenum, hafnium, tantalum, tungsten, rhenium, yttrium, osmium, uranium, thorium, plutonium, nitrogen, oxygen, and combinations thereof.

The direction of fiber within the fabric, each layer within said fabric, and the array of standing fibers normal to the fabric may each be of a different constitutive material.

In one embodiment, the invention comprises a composite material structure in which a matrix composed of an ordinarily solid material selected from a group consisting of boron, carbon, aluminum, silicon, titanium, zirconium, niobium, molybdenum, hafnium, tantalum, tungsten, rhenium, yttrium, osmium, uranium, thorium, plutonium, nitrogen, oxygen, and combinations thereof is reinforced with the non-woven fiber architecture described herein. The array of standing fibers running normal the surface of the non-woven fabric may be anchored into a metallic foil, thus forming a hybrid composite with the metal substrate.

In another aspect, the invention comprises a three-dimensional fabric having an array of fibers that do not interlace or interweave with each other, therefore preserving fiber strength, including an array of standing fibers extending the thickness of the fabric or more, and (i) grown off a thin layer of expendable material, such as glass or carbon, or (ii) grown off a layer intended to become part of the fabric, such as a tantalum foil, or (iii) grown directly off a mandrel (such as an airfoil or a tube) to directly form a finished CMC shell integrally attached to said mandrel; and at least one layer of parallel fibers running in the plane of the fabric in between said standing fibers. In one embodiment, the at least one layer of fibers running in the plane of the fabric is one fiber layer thick.

In yet another aspect, the inventions comprises a ceramic matrix composite or carbon-carbon composite with standing fiber forests protruding in order to provide attachment to an infiltrated or deposited metal base.

In another aspect, a microsensor may be in embedded into and/or assembled as part of, the fabric to form an integral part of the fabric's function. A functional layer of the sensor may comprise a conductive layer joined at one end to a second different conductive separated by an insulating layer, to form a thermocouple pair according to the Seebeck effect. Multiple thermocouple pairs may be connected in series to form a thermopile according to the Seebeck and Thompson effects.

The fabrics disclosed herein may be formed by any of the methods disclosed herein, in accordance with one or more aspects of the present invention.

Additional features and advantages are realized through the techniques described herein. Other embodiments and aspects of the invention are described in detail herein and are considered a part of the claimed aspects.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIGS. 6A-6B depict an example structure including multiple nuclear fuel rod structures and control rod structures, illustrating one possible structure for encasing and storing nuclear fuel structures;

DETAILED DESCRIPTION

Figure 1:
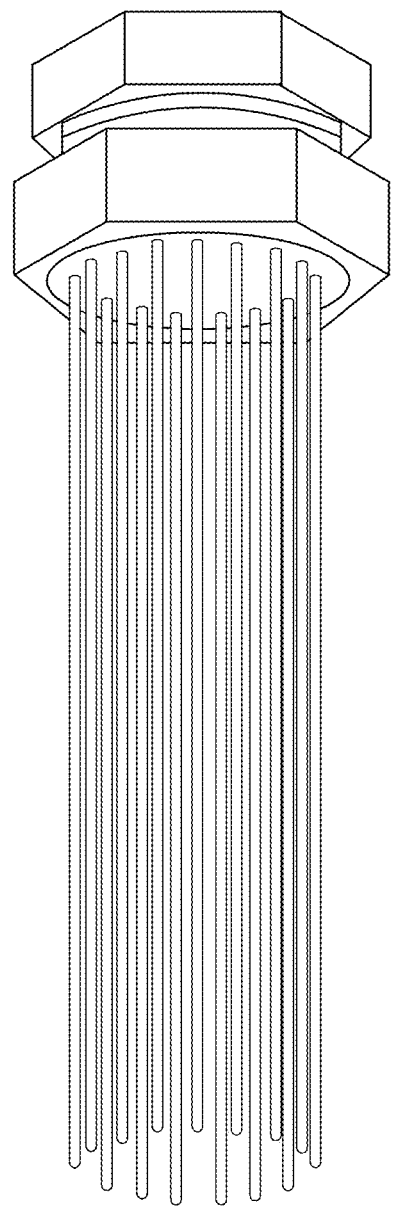
FIG. 1 is a schematic representation of a spinneret, a plate with a pattern of tiny holes through which a liquid precursor is fed, and upon exit, the stream pattern gels into filaments called "green fibers"

Aspects of the present invention and certain features, advantages and details thereof, are explained more fully below with reference to the non-limiting example(s) illustrated in the accompanying drawings. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application, as described herein.

This invention rests upon a novel manufacturing paradigm, inspired from cross-cutting advances in additive manufacturing ('AM'), micro-electromechanical-systems ('MEMS') design and nano-fabrication, and ceramic matrix composites ('CMCs').

Before describing the above-noted aspects further, some definitions are provided which will aid in the below description.

Additive Manufacturing ('AM') generally refers to the act of building up a material object by incretion or accretion.

Incretion is usually common in biological constructs, where the elemental building material comes in the form of cells that are created, transported and deposited in place by the construct itself. Examples of material objects built by incretion include fingernails, hair, bones, shells, plants, muscles, etc. Incretion is a natural characteristic of living organisms' growth and maintenance and does not appear to have any obvious technological equivalent.

Accretion refers to the process of adding constitutive material over a substrate and is found both in natural and technological constructs. Examples of accretion include natural geological formations like sand dunes, alluvial plains, stalactites and stalagmites, architectural constructs such as the pyramids or modern buildings, or technological artifacts such as vehicles. In all instances the material object resulting from accretion is the result of joining constitutive elements. In the case of alluvial plains, it may be boulders, rocks, and alluviums transported and deposited by natural water flows. In the case of dunes, the constitutive elements are grains of sand transported and deposited by air flows. In the case of stalactites and stalagmites, the constitutive elements are molecular elements coming out of solution and accreting. Architectural structures like the pyramids are an accretion of cut quarried stones, whereas modern buildings are an accretion of beams, shells, blocks, held together by fasteners or bonding agents like concrete. Many technological objects, like vehicles, are made up of accretion of components that are cut out or formed out of a generic stock, or components that are an assembly thereof.

Additive manufacturing is a technological implementation of accretion whereby generic constituents are joined together to form the desired material object, usually under computer control. The generic constituents can come in the form of elemental molecules, point-like elements such as powders, line-like elements such as fibers, filaments, and extruded pastes, surface-like elements such as tapes and sheets, or volume-like elements such as bricks. Examples of additive manufacturing processes that proceed from elemental molecules include Chemical Vapor Deposition (CVD) or Physical Vapor Deposition (PVD) used in producing microelectronics. Numerous additive manufacturing processes proceed from flat layers of powder where individual grains are joined together selectively and bonded to the underlying layer to form an incremental cross-sectional layer of the object under construction. Filament winding and fused deposition modeling are examples of additive manufacturing processes where the constitutive material is brought in as a line-like element. Tape layup and laminated object manufacturing are examples of additive manufacturing processes where the constitutive elements are brought in as sheet-like elements.

Note that when additive manufacturing processes build up a material object in layers, those layers do not need to be flat. When they are, however, the technique is usually referred to as "3-D printing" by analogy to 2-D printing on a sheet of paper.

Additive manufacturing, as disclosed in certain embodiments herein, can have a great affect on nuclear fuel design and many other composite structures where added functionalities can be built into the constitutive fibers. This appears especially true for disruptive advanced fuel concepts (AFC) that are not conceivable without the extreme flexibility of AM. An opportunity exists in design methodology for particular fuels exhibiting enhanced accident tolerance, increased efficiency, and smaller environmental footprint than the standard $UO_2$—Zr system. The fundamental AM technique upon which embodiments of this invention are based is known as Laser-Induced Chemical Vapor Deposition (LCVD).

The vast majority of previous additive manufacturing processes are strongly dependent upon the properties of the build material. For example, joining powders by locally melting them requires a precise knowledge of the melting point and a precise control of the local temperature during buildup. Very few additive manufacturing processes can function independently of material properties, those that do are called "Material Agnostic".

LCVD is used in embodiments disclosed herein as the fundamental AM tool due to its near material independence, which is an extremely rare property for AM processes. LCVD is a technique derived from CVD, used intensively in the microelectronics fabrication industry (aka "Chip Fab"). CVD builds up electronics-grade high-purity solid deposits from a gas precursor. In its 75+ year history, Chip Fab has accumulated an impressive library of chemical precursors for a wide range of materials, numbering in the 10's of thousands, including fissile material precursors (e.g. $UF_6$). The main difference between CVD and LCVD resides in dimensionality and mass throughput. CVD is intended for 2-D film growth whereas LCVD is ideally suited for one-dimensional filamentary structures. The dimensionality difference means that deposition mechanisms are greatly enhanced for LCVD vs. CVD, leading to deposited mass fluxes ($kg/m^2$ s) that are 3 to 9 orders of magnitude greater. For example, diamond-like carbon filaments have been measured at linear growth rates upwards of 13 cm/s, which represents a 9 order of magnitude increase in mass flux compared to thin film CVD of the same material. Finally, compared to extant fuel manufacturing, LCVD is essentially containerless, which virtually eliminates opportunities for material contamination by container or tool. Thus, according to embodiments disclosed herein, LCVD, and 1½D-printing, further described below, allow for the material of a fiber to be tightly controlled. Additionally, due to the change in focus of the laser and the containerless growth, the material of a fiber is capable of being altered or completely changed to a new material system in situ, that is, during growth of a fiber, allowing for nearly instantaneous changes to the material system of the fiber. Benefits of the material agnostic growth will be further described below.

Many applications of this invention, including nuclear applications, are enhanced by material-agnostic AM processing; for example the capability to process nuclear fuels and nuclear reactor-grade materials in a manner that is material agnostic.

As described herein, a new design space is described in one or more embodiments, from which manufacturing can emerge as an axiomatic-based science. The ability to print fibers, in some embodiments on a substrate, and in further embodiments many fibers in an array simultaneously, describe fundamental properties formally defined as "1½-D Printing" AM (by analogy to 3-D printing).

To implement 1½-D printing, Laser Induced Chemical Vapor Deposition (LCVD) was chosen as the fundamental Additive Manufacturing (AM) tool for its near material independence—an extremely rare property for AM processes. Such a process is said to be "Material Agnostic".

Figure 8:
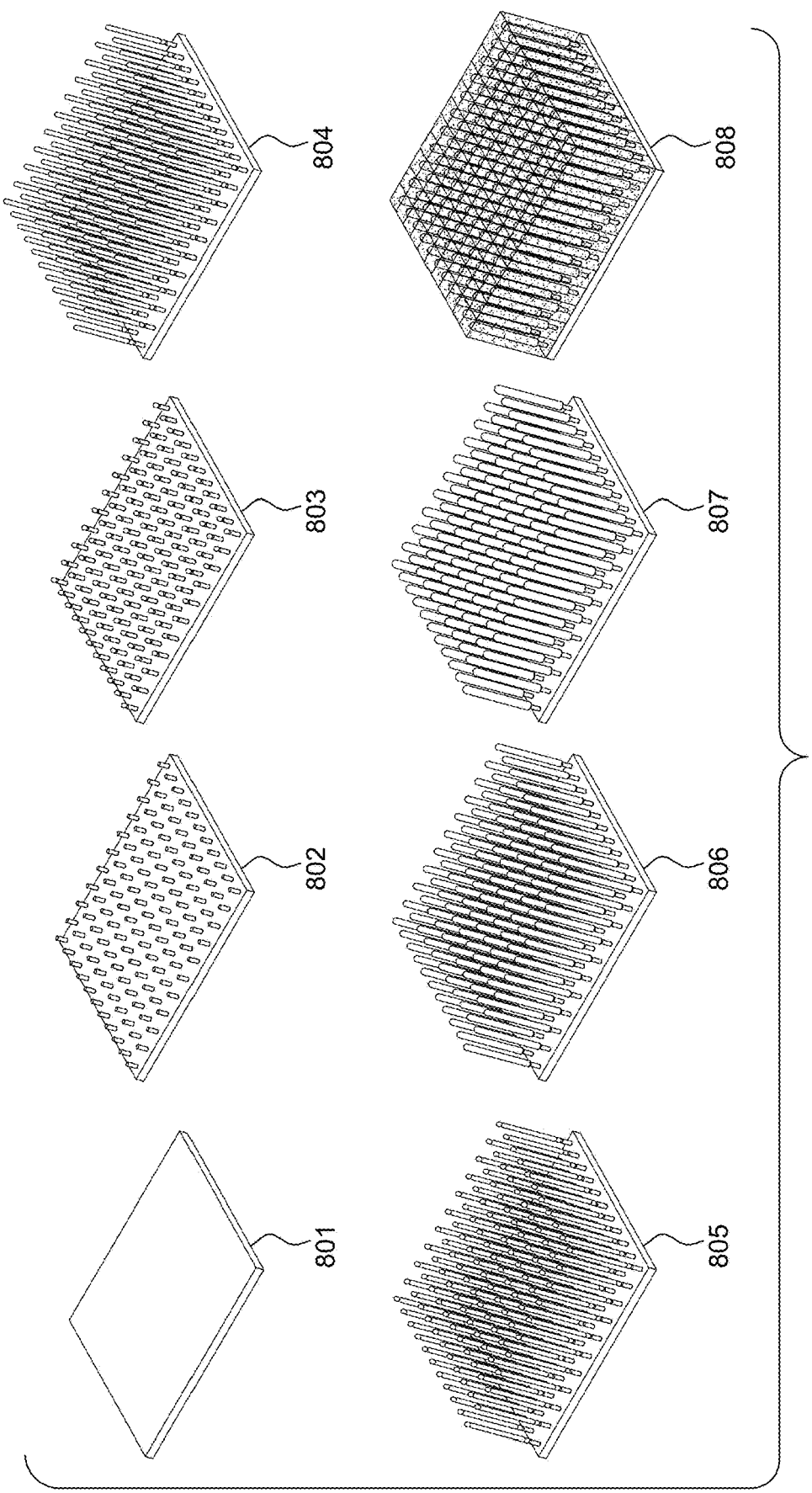
FIG. 8 illustrates a process for forming a rectangular array of fibers, in accordance with one or more aspects of the present invention.

For the purpose of this application, the term "1½-D Printing" designates an AM process exhibiting the following defining properties:

1. Material-agnostic ability to grow filaments.
2. Ability to vary diameter and axis along the length of the filament.
3. Material-agnostic ability to vary composition along the length of the filament.
4. Material-agnostic ability to coat specific sections of filaments with a desired material, morphology and thickness—called "SPOT COATING"—as illustrated in FIGS. 8 and 11 of the above-incorporated U.S. Pat. No. 10,546,661, entitled "Additive Manufacturing Technique for Placing Nuclear Reactor Fuel Within Fibers".

These four axiomatic properties constitute a set of manufacturing tools that defines a brand new range of nuclear-material capable filamentary constructs, unleashing new designs, a few examples of which will now be discussed.

For instance, using embodiments described herein, there is an ability to grow filaments in a material-agnostic method or methods, meaning that the material or materials of a fiber, or filament, according to embodiments described herein, can be altered in stoichiometry, or completely changed during the growth of the fiber, or filament. For instance, High Performance Fibers (HPFs) are being proposed for expanding uses in many specialized applications, such as military and aerospace (turbo machinery, rockets, advanced structures), automobile, biomedical, energy, and other applications that require advanced materials with exceptional strength, stiffness, heat resistance, and/or chemical resistance. HPFs are sought when a combination of extreme material properties is required which cannot be met by existing metal filaments or by carbon, glass, vegetal, or mineral fibers. HPF composite systems generally include a plurality of coated fibers, distributed within a "matrix."

Figure 2:
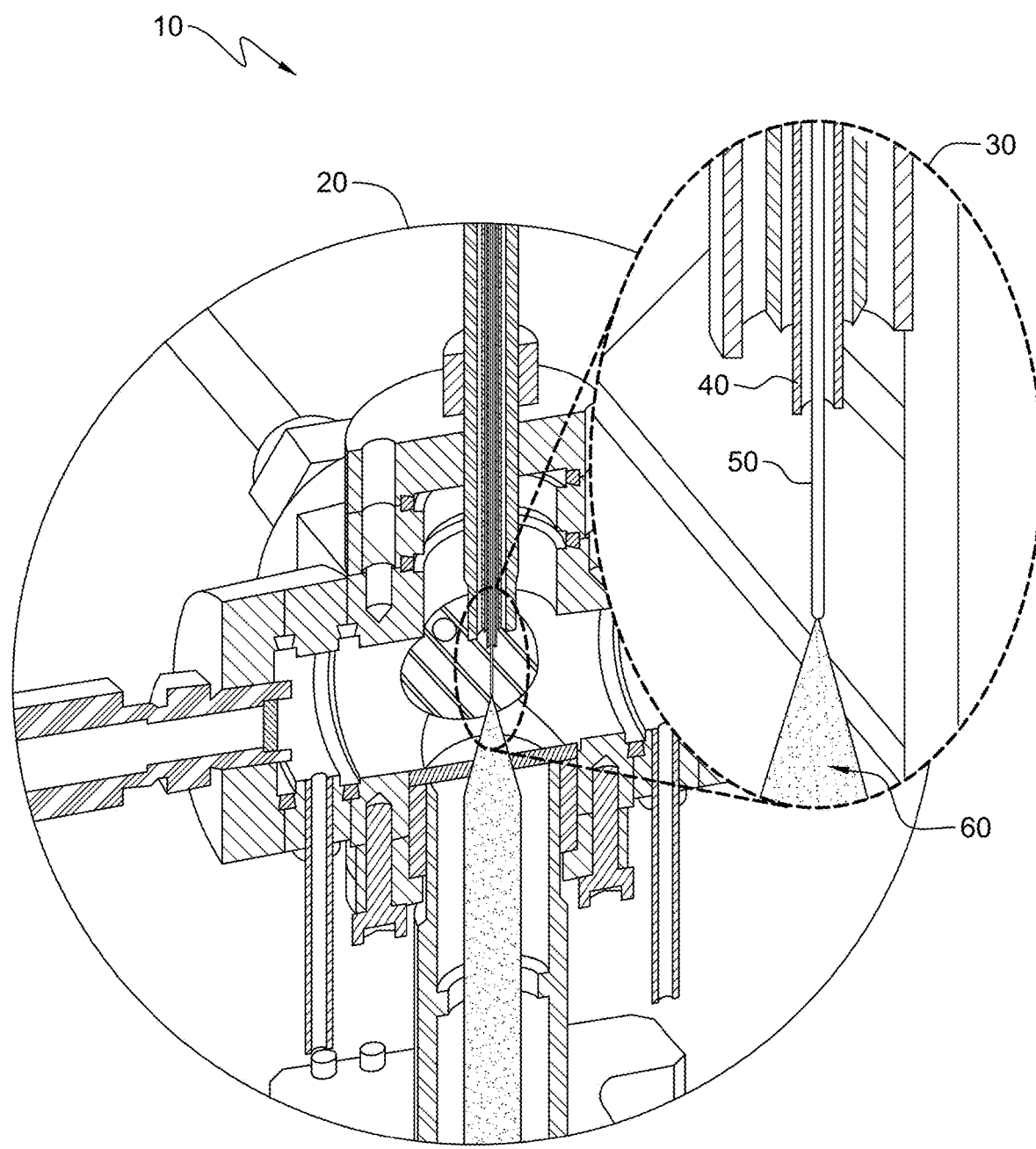
FIG. 2 is a schematic view of an exemplary process for forming a monofilament fiber.

In most cases currently, fiber formation is accomplished by passing a liquid precursor through a spinneret. For example, FIG. 1 is a schematic representation of a spinneret, a plate with a pattern of tiny holes through which a liquid precursor is fed. Upon exit, the stream pattern gels into filaments called "green fibers". This prior art, however, assumes that the fiber material can exist in either a liquid, gel, or plastic form that lends itself to flowing through a small opening. In many instances, and especially for refractory materials, such a liquid or near liquid state does not exist. The present inventors have concluded, therefore, that when a spinneret is incompatible with the fiber material properties, a better approach involves extracting fiber out of a laser focus where the fiber is created from surrounding fluid precursors, which is not possible using the spinneret of FIG. 1. A laser is focused on the fiber tip thereby heating the fiber to temperatures at which the precursors dissociate and Chemical Vapor Deposition (CVD) takes place. The fiber grows in length and is pulled out of the reaction zone at the growth rate, resulting in the creation of an arbitrarily long monofilament fiber. This process technology, according to embodiments of the current invention, is illustrated by FIG. 2. FIG. 2 is a schematic of an exemplary process as follows including a reactor 10; enlarged cutout view of reactor chamber 20; enlarged view of growth region 30. A self-seeded fiber 50 grows towards an oncoming coaxial laser 60 and is extracted through an extrusion microtube 40. CVD precursors are injected into the reaction zone from the extrusion microtube forming a small high concentration plume around the reaction zone that feeds and convectively enhances growth. This plume is embedded in a coaxial flow of inert gas that shields the reaction and carries away diluted by-products. This reactor design builds upon understanding of Laser Induced Chemical Vapor Deposition (LCVD) fiber growth. It provides a unique and valuable materials science laboratory, suited for rapid experimental development of specialty filaments. It may be, however, unfit for large scale manufacturing.

As in the microelectronics fabrication industry, where features are massively replicated using optical (photolithographic) methods, large scale replication of fiber growth is herein proposed. Pure optical parallelization for fiber growth is one approach to mass production of fibers. For example, a parallelization of the process technology illustrated by FIG. 2 can be pursued.

In pursuing large scale manufacturing objectives, however, certain features of the FIG. 2 approach should be preserved, such as:

Feature 1—Convection enhanced high-pressure precursor flow—has been shown to optimize single fiber growth.

Feature 2—Imaging at wavelengths that are specific to byproducts (e.g. Hydrogen at 656 nm)—provides for direct observability of fiber growth and has been used for process control.

Feature 3 and 4 respectively—Containerless and Material-agnostic-form the basis for a platform technology capable of processing a wide range of materials.

Figure 3:
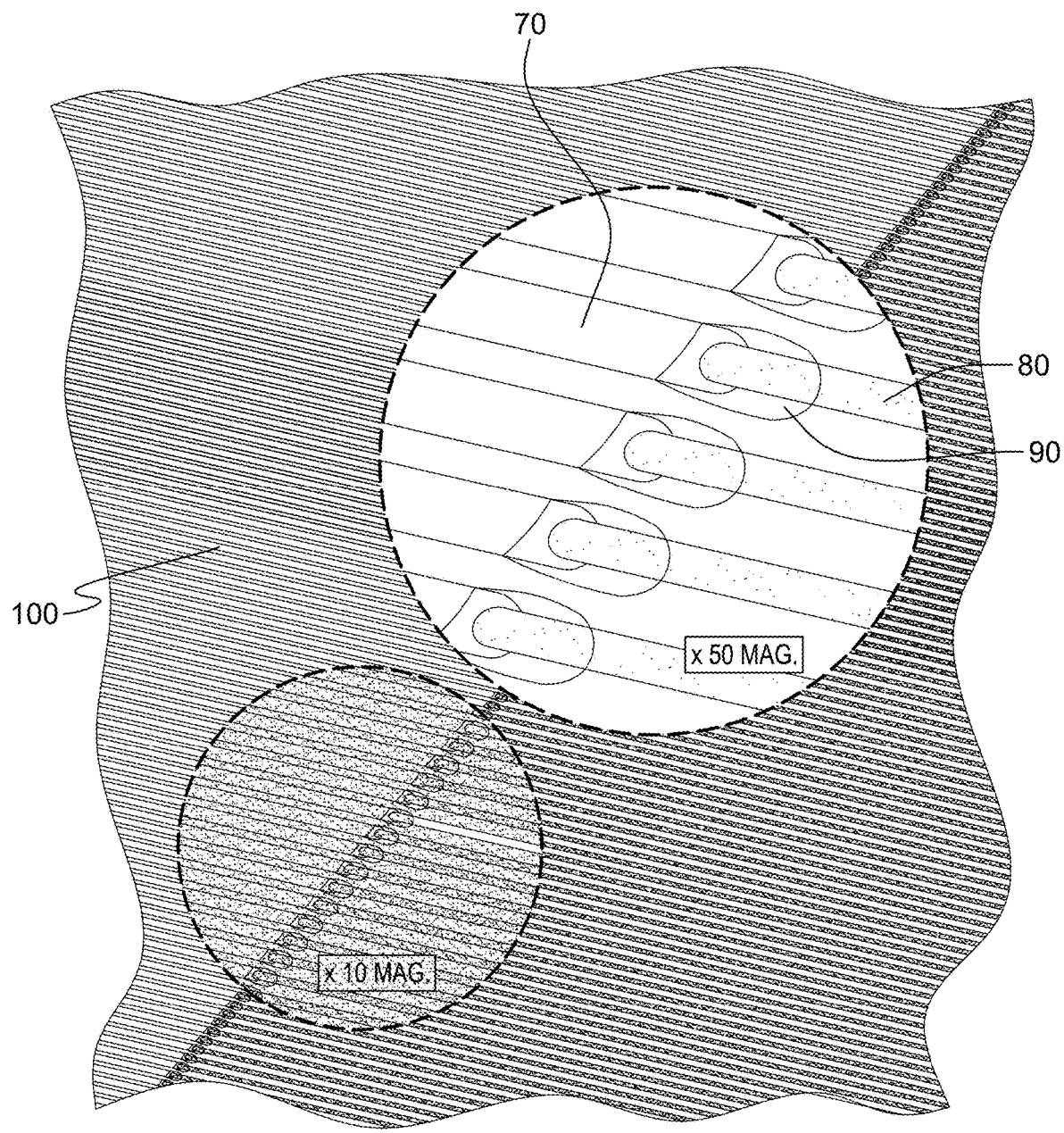
FIG. 3 is a schematic view showing how, in accordance with the present invention, fiber LCVD is massively parallelized by multiplication of the laser beams.

The present invention, in one embodiment, involves the use of a large array of independently controlled lasers, growing an equally large array of fibers 80 in parallel, as illustrated in FIG. 3, showing how fiber LCVD can be massively parallelized from a filament lattice 100 by multiplication of the laser beams 80 inducing a plasma 90 around the tip of each fiber 80. In embodiments of the current invention, the large array of fibers 80 can be directed toward a substrate, growing standing fibers in a large array directly on a substrate, and controlling the environment at the tip of the laser to control the material system, and change the material system, of the fibers.

Figure 4:
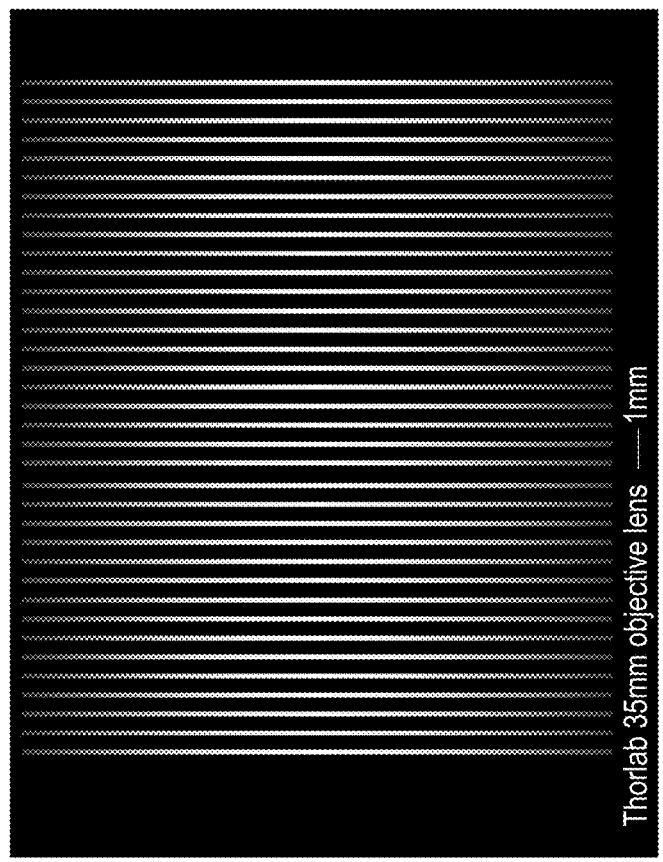
FIG. 4 shows parallel LCVD growth of carbon fibers using a module including 64 individually controlled laser emitters, in accordance with the present invention.
Figure 4:
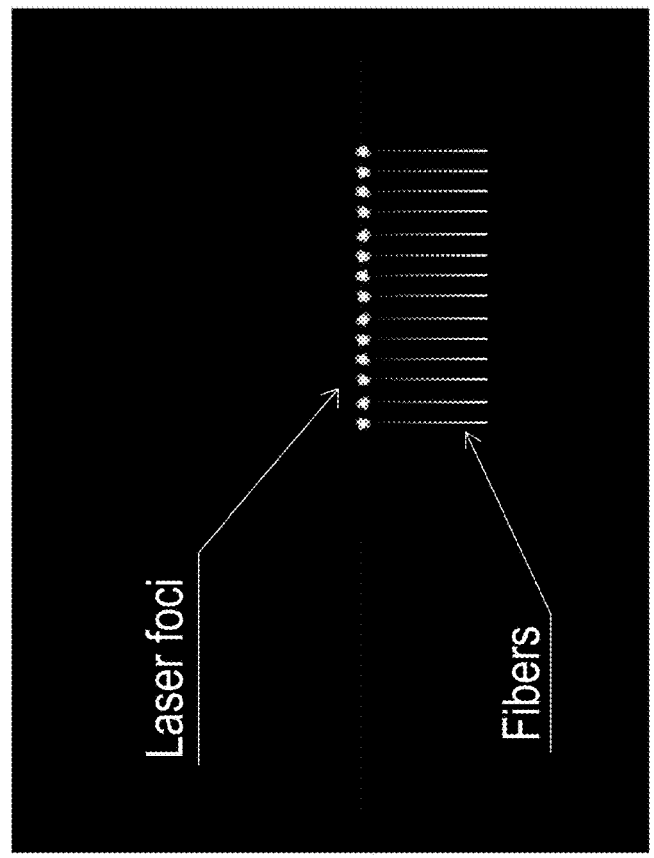

Using a Computer to Plate (CtP) (e.g., Quantum Well Intermixing (QWI)) laser array for LCVD is a scientific first, and so was the use of a shallow depth of focus. It provides very beneficial results. Sample carbon fibers, such as those shown in FIG. 4, were grown in parallel. FIG. 4 shows parallel LCVD growth of carbon fibers using a unit with multiple lasers, for instance 64 or more. Left: Fibers during growth. Right: Resulting free standing fibers 10-12 µm in diameter and about 5 mm long.

In all prior instances the beam was focused to a diffraction limited spot with long Raleigh range. In accordance with the present invention, not only is the focus intense enough to sustain CVD, but the shallow depth of field means that fibers could only grow in a small region in the front and back of the image plane. This goes against commonly accepted practice in LCVD where long depths of field are favored to maximize the growth region. The advantage of a shallow depth of field is important because of the level of control it could afford. For example, if one fiber stopped growing for any reason, the focus can be moved back to that fiber tip. All other growths would stop and then restart as the lagging fiber was pulled back to the same level as the others.

The effect of a shallow depth of focus according to some embodiments of the invention, is illustrated in FIG. 4. The uneven focus-to-focus power distribution of diffraction gratings combined with the long depth of focus of diffraction limited optics prevents any control over the position of the growth front in previous fiber arrays. A major benefit is evident in FIG. 4: Fibers are grown in unison, and to the same height. This was an unexpected benefit of source imaging over diffraction limited optics because the depth of focus is 5 to 30 times (vertical and horizontal respectively)

shallower than the Rayleigh range of an equivalent diffraction limited focus. This turns out to be a huge advantage as fibers quickly grow in and out of focus. This makes it possible to track fiber growth, and even backtrack to retrieve fibers that stopped growing without affecting any of the other already grown fibers. This unique feature of the CtP laser bars is expected to represent a major advantage in controlling future parallel LCVD growth for fiber arrays.

Another advantage to fibers of a fiber structure according to one or more embodiments of the current invention is the ability to vary diameter along the length of a filament or fiber, similar to methods disclosed in U.S. Pat. No. 10,546,661 (which is incorporated herein by reference above). Advantages of varying the diameter along the length of a fiber may be better understood, for instance, in reference to a nuclear application of said materials.

Figure 5:
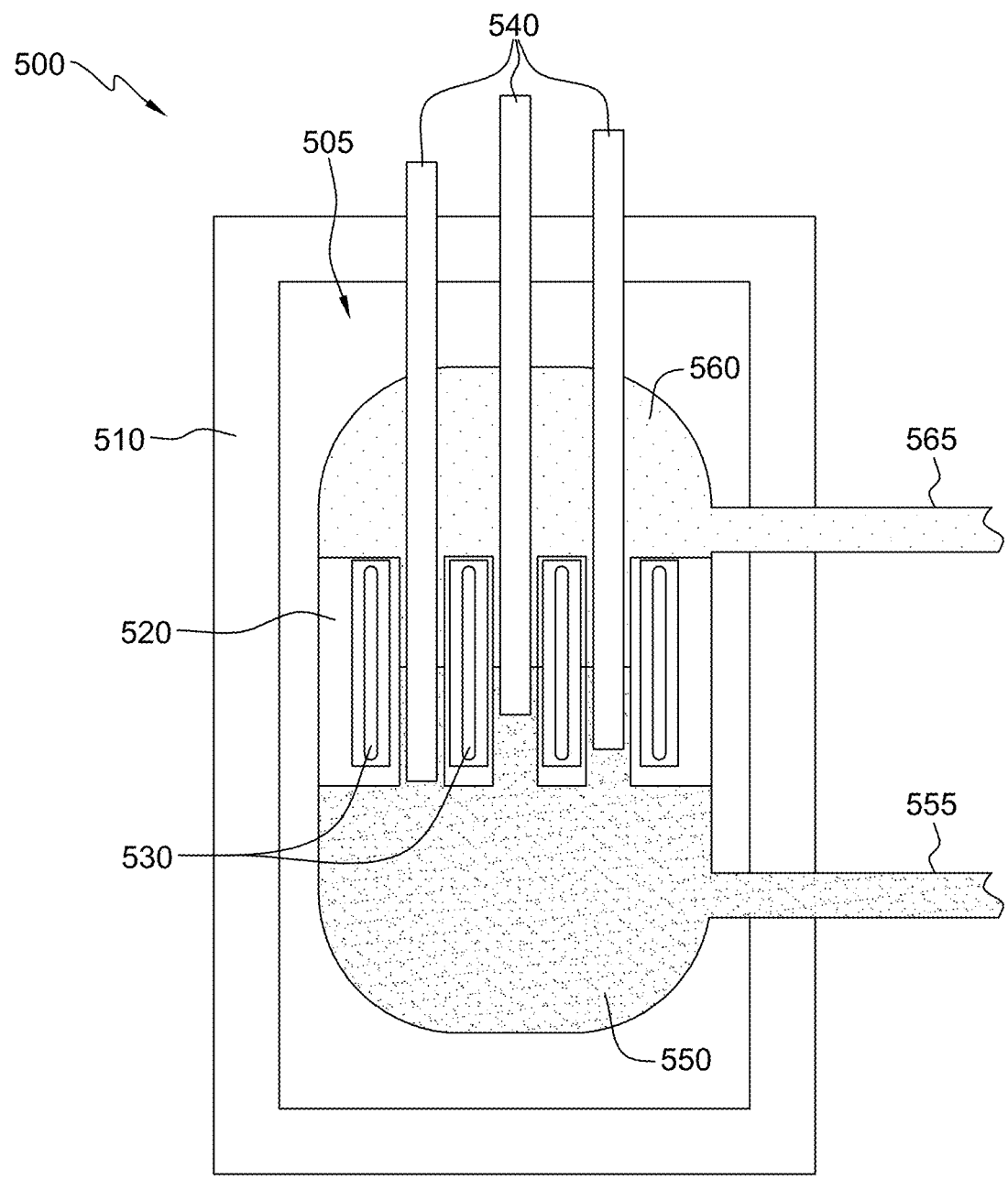
FIG. 5 depicts an exemplary layout of a nuclear reactor, illustrating generally the use of nuclear fuel structures in nuclear reactor operation.

For instance, turning to FIG. 5, illustrated is a simplified schematic of an example nuclear reactor 500, as may be part of a nuclear power plant. The nuclear reactor 500 depicted in FIG. 5 includes a reactor vessel 505 encased inside a reactor shield 510, which may be made of concrete or other material capable of withstanding high temperatures, so that material within the reactor shield 510 may be contained in the event of an accident. Reactor vessel 505 includes a core 520 in which nuclear fuel rods 530 and control rods 540 are disposed. Reactor vessel 505 also holds a coolant material 550, such as water or heavy water, which may be drawn into reactor 505 through a coolant inlet 555. Fuel rods 530 include a nuclear fuel material, frequently uranium dioxide fuel capsules, encased in a metal alloy fuel rod casing or cladding, such as a zirconium alloy metal casing. (Many nuclear fuel rods make use of zirconium alloy cladding materials produced under the trademark name Zircaloy.) The nuclear fuel material is bombarded with neutrons that can initiate a fission reaction in the nuclear fuel; the reaction splits the nucleus of the nuclear fuel material, releasing heat energy and additional neutrons that subsequently continue the fission reaction. The heat energy heats the coolant 560, which may then be pumped out of reactor vessel 505 via coolant outlet 565; the heated coolant 560 may be used, for example, to generate steam to drive turbines that in turn generate electrical energy (not depicted in FIG. 5 for simplicity). Core 520 may be made of one or more moderator materials, such as graphite, capable of slowing neutrons down to speeds at which the neutrons are more likely to react with the nuclei of the nuclear fuel material. Coolant material 550 may also act as a moderator material to slow down high-speed neutrons bombarding fuel rods 530. Control rods 540 may be used to variably control a fission rate of the nuclear fuel material in fuel rods 530. Control rods 540 may be made of one or more materials capable of absorbing neutrons without undergoing a fission reaction, such as boron, silver, cadmium, and/or indium. As control rods 540 are pulled out partially or fully from the reactor vessel 505, more neutrons may successfully bombard and react with nuclear fuel material in fuel rods 530, increasing energy output; conversely, by inserting the rods further or fully into reactor vessel 505, more neutrons may be absorbed and the nuclear fission reactions slowed to reduce energy production. In some nuclear reactors, fully inserting control rods 540 may be used to fully stop fission reactions in fuel rods 530.

FIGS. 6A and 6B illustrate an example of a nuclear fuel assembly 600, as may be deployed in a nuclear reactor. Generally, nuclear fuel rods 630 and control rods 640, as depicted in FIG. 5, are not deployed separately in a nuclear reactor, but are more often deployed in a nuclear fuel assembly such as nuclear fuel assembly 600. Nuclear fuel rods 610 may be arrayed together with control rods 620 interspersed among the nuclear fuel rods 610, and both nuclear fuel rods 610 and control rods 620 bound by one or more spacers 630. The entire nuclear fuel assembly 600 may be deployed within a nuclear reactor vessel, such as reactor vessel 505 of FIG. 5, so that the nuclear fuel assembly is surrounded by moderator materials, such as the core 520, and coolant 550 may flow around fuel rods 610 and control rods 620. The control rods 620 may be coupled with controls within or outside the reactor vessel so that the control rods 620 may be variably withdrawn or inserted further into nuclear fuel assembly 600, as illustrated by FIG. 6B.

Referring to FIG. 5 again, it may be noted that coolant 550 may serve several purposes within nuclear reactor 500. Coolant 560, being heated by the heat generated from fission reactions, carries away heat from the fuel rods 530 and core 520, and the heat energy of coolant 560 may be converted to electrical energy. As well, coolant 550, 560 may act as a moderator to slow neutrons to speeds at which they are more likely to successfully react with nuclear fuel material. In a loss of coolant accident (LOCA), coolant levels may drop within the reactor vessel 505 so that heat energy is no longer adequately conveyed out of the reactor, allowing heat to build within the reactor and potentially damage fuel rods 530, including the casing material. Although a loss of coolant may also represent a loss of moderator material, and thus result in a slow-down of fission reactions in the nuclear fuel material, heat may still build rapidly in the reactor vessel as the radioactive nuclear fuel materials, as well as radioactive by-products of fission reactions, continue to radiate heat energy into the reactor. Both the Three Mile Island disaster and the Fukushima Daiichi disaster began as loss of coolant accidents, resulting in a meltdown and highly exothermic oxidation of the zirconium alloy cladding, producing vast amounts of hydrogen gas and resulting in further heat build-up and a subsequent core meltdown. Once the cladding of fuel rods has been breached or cracked in a meltdown, the radioactive nuclear fuel and its radioactive fission by-products may be exposed and mix with other gases produced by the meltdown, allowing the radioactive materials to escape into the surrounding environment.

Utilizing any of the above embodiments, fibers can be grown on a substrate using LCVD. In fact, fibers need not be continuous either. Massive arrays of short composite fibers with inner structure analogous to the one depicted in FIG. 7 can be derived by parallel deposition onto a base wafer using a reactor according to embodiments detailed above. A fiber array of fibers as illustrated in FIG. 7 can be printed, in some embodiments simultaneously, in order to model an array of these fiber which are implementable in fuel pellet, in some cases directly.

Disclosed herein, thus, is a method for fabricating a fiber structure. The method can include providing a substrate, which may include a refractory material, or a typical wafer type substrate, as well as a fiber structure previously formed according to the below aspects as a substrate, due to the material agnostic abilities of the methods herein described. A plurality of fibers, according to any of the above or below described embodiments, may be grown upon the substrate. Utilizing LCVD and/or 1½ D printing, materials such as actinides can be grown as fibers, which was not previously possible. In some embodiments, the fibers can include a first material selected from a group consisting of beryllium, boron, carbon, sodium, magnesium, aluminum, silicon, potassium, calcium, scandium, titanium, vanadium, chromium, manganese, iron, cobalt, nickel, copper, zinc, gallium, arsenic, selenium, rubidium, strontium, yttrium, zirconium, niobium, molybdenum, ruthenium, rhodium, palladium, silver, cadmium, indium, tin, antimony, tellurium, cesium, barium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, yttrium, osmium, iridium, platinum, gold, thallium, lead, bismuth, polonium, francium, radium, actinium, thorium, protactinium, uranium, *neptunium*, plutonium, americium, curium, berkelium, californium, einsteinium, fermium, nitrogen, oxygen, fluorine, sulfur, chlorine, iodine, mercury and combinations thereof. At least one of the fibers may include uranium Mononitride (UN). Additionally, at least one of the fibers may include triuranium disilicide (U3Si2). As should be clear to one of skill in the art, the plurality of fibers can include at least a first set of fibers of one material, and at least a second set of fibers of a second material. These fibers may be arranged in an array, forming the fiber structure or a part of it. The spacing between fibers is such that neighboring fibers do not occlude lasers during deposition. It can range from twice the diameter of the fibers to the length of the fiber, for instance up to approximately 100 times the diameter of the fibers, wherein the fibers each have approximately the same diameter, or wherein the sets of fibers each within the set of approximately the same diameter. In some embodiments, the diameter may vary across sets of fibers. In some embodiments, a layer may be formed over the fibers including a second material selected from the same group, but being of a different composition that the first material. A matrix material can be provided, surrounding the fibers of the fiber structure. Before or after this, a different material may be grown on the fibers, utilizing LCVD, in part due to the material agnostic ability of the process.

Figure 7:
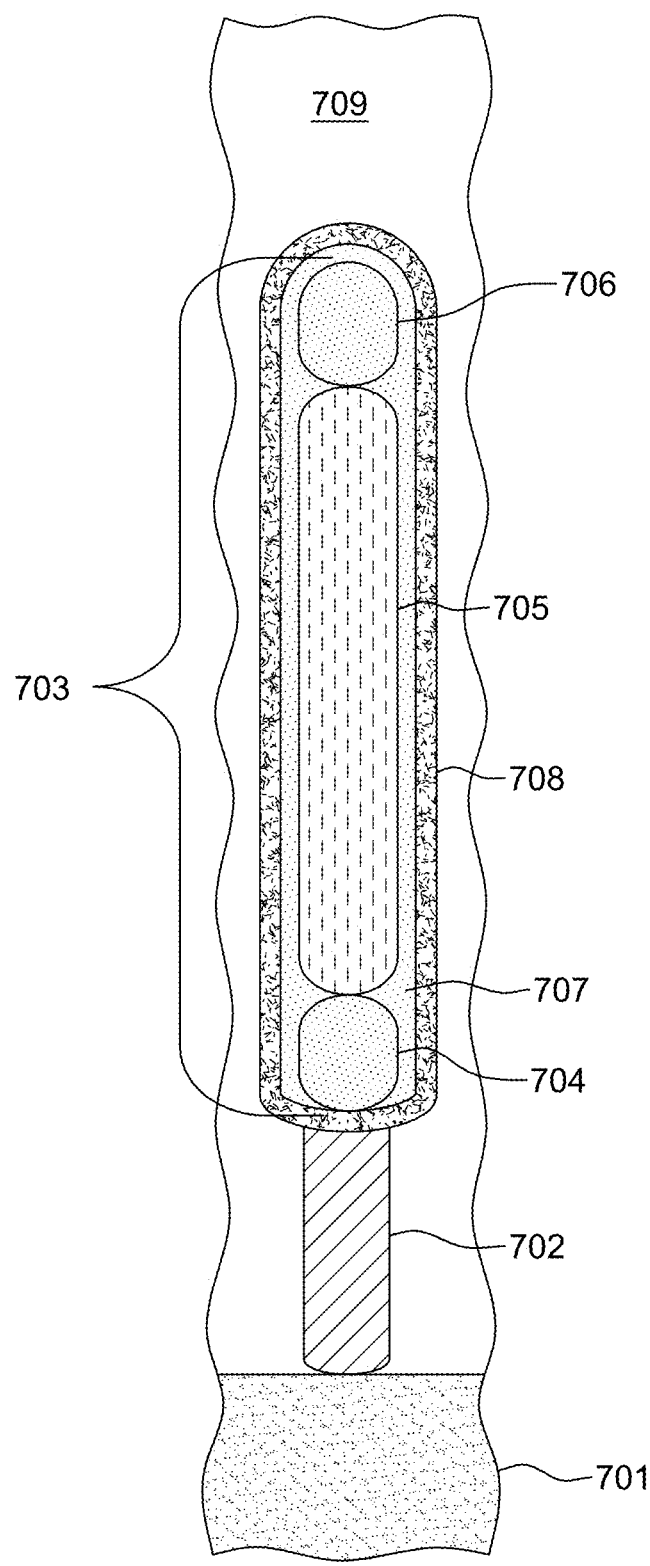
FIG. 7 shows a sample cross-section of a single Fuel Fiber, in accordance with one or more aspects of the present invention.

FIG. 7 illustrates one such fiber, created by embodiments which include a method of growing a fiber structure, in some embodiments an array, of said fibers. Methods disclosed herein may constitute an approach to fuel pellet fabrication which can be incorporated in fuel cells much like advancements were made in integrated microelectronics. The fiber of FIG. 7 illustrates a substrate 701 upon which a pedestal fiber 702 is grown. The pedestal fiber 702 can separate the fibers grown thereon from the substrate, providing an insulative structure for the fibers. Fibers 703 are grown on the pedestal fiber 702. In some embodiments, the fibers 703 can include a first short fiber 704, a long fiber 705 on the first short fiber 704, and a second short fiber 706 on the long fiber 705. Due to the material agnostic abilities, each of these grown elements can include different compositions of material, different sizes, or a combination thereof. Additionally, each fiber structure is capable of including a multi-layer fiber as described in above embodiments, and can include embedded sensors and/or actuators in some or all of the elements, or across some or all fibers in an array. Deposited around the fiber 703 is a coating 707, around which, in some embodiments, is a protective coating 708. Surrounding fibers 703 and pedestal fibers 702, is matrix 709, according to some embodiments. It should be clear that the fiber of FIG. 7 is one of a set of fibers, which can form an array comprising a fiber structure of such fibers. The fiber as illustrated is not drawn to scale, as the height may be approximately the same as that of a fuel pellet thickness (typically 1-2 cm in some embodiments).

FIG. 8 illustrates a method, according to some embodiments, of the process steps on, for instance, a square sub-section of a circular wafer, with a diameter approximately matching that of the pellet (which may include, in some embodiments, a diameter of 10-15 mm). For clarity, the length scales as shown perpendicular to the wafer have been shrunk according to some embodiments. In certain embodiments, the height after the last process step is to match the pellet thickness. In step 801, a substrate is provided. The substrate can include a wafer substrate which may be made of a refractory, oxidation resistant, material such as SiC, ZrC, or BeO, or it may include a glass ceramic such as BMAS, BSAS, or Zirconium Silicate. In some embodiments, the substrate is not a flat surface, although not illustrated, and can include fibers previously formed according to embodiments herein described, or any solid surface. In some embodiments, at step 802, an optional array of pedestal fibers, in one or more embodiments of a refractory material such as C or SiC, are grown upon the substrate. At step 803, a first set of short fibers, which may be of $U_3Si_2$, are grown on the pedestals, or the substrate if no pedestals are present. At step 804, long fibers, in one or more embodiments of uranium mononitride (UN), are grown on the first set of short fibers. At step 805 a second set of short fibers, which can include uranium disilicide ($U_3Si_2$) can be grown on the long fibers, although the second set of short fibers is not necessary. With the pedestal fibers acting as an insulator separating fibers from the substrate, the first and/or second short fibers can act as caps for the fibers. Functionality can include further insulation, or these could be electrodes or storage for the long fiber. At step 806, the entire structure, minus the pedestals and substrate, may then be coated by depositing a coating surrounding each of the fibers, in some embodiments utilizing LCVD. In one or more embodiments the coating may include $U_3Si_2$. The coating can add functionality or enhance functionality of the fiber. In step 807, a protective layer may be deposited over the coating. The protective layer may include one or more layers of, for instance, SiC, BeO, or C, according to one or more embodiments of the invention. The protective layer may protect the fibers and/or coating from environmental wear, as well as isolate the fiber structure from its surroundings. At 808, a matrix material may be provided, surrounding the fibers of the fiber structure. Such matrix material may be a refractory ceramic such as Silicon Carbide, or Zirconium Carbide, a metal such as tungsten, or the matrix may itself be a nanocomposite material, for example a Silicon Carbide whiskers-reinforced Silicon Carbide matrix. In one or more embodiments, another fiber structure may be grown directly on top of the fiber structure following this process, with or without the matrix material being provided. Thus, a previous fiber structure may act as a substrate for further fiber structure fabrication.

While UN and $U_3Si_2$ are described above, the fibers may also utilize any uranium nitride, as well as carbon-molybdenum-uranium and carbon-tungsten-uranium. For instance, uranium tungsten carbide (UWC) and uranium molybdenum carbide (UMoC) can be used when designing a nuclear fuel.

Figure 9A:
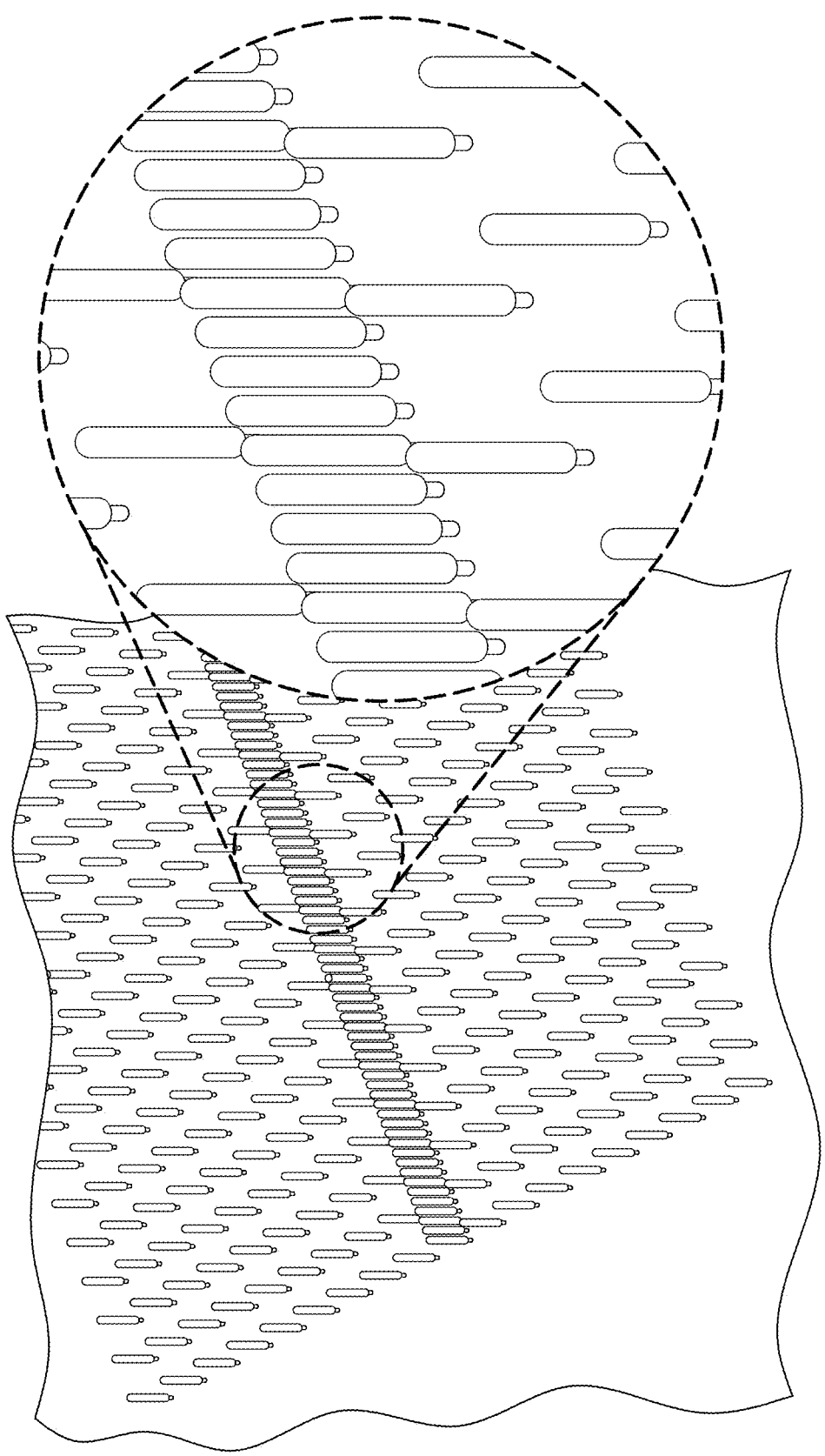
FIG. 9A illustrates an example fiber structure, in accordance with one or more aspects of the present invention.
Figure 9B:
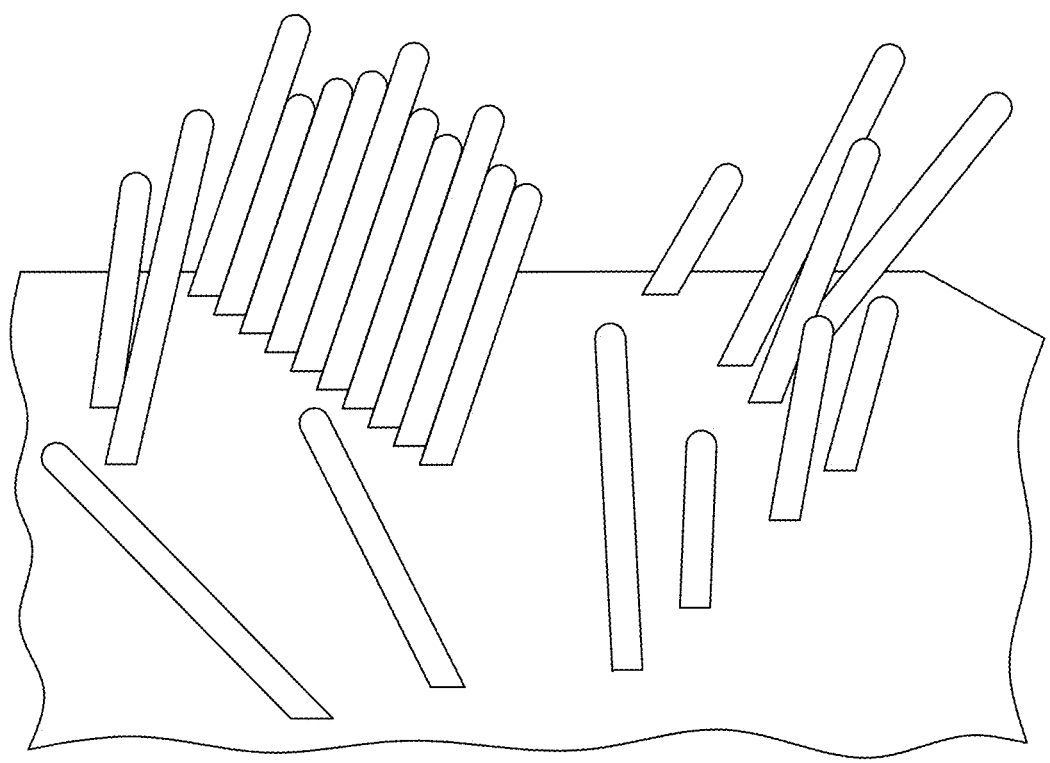
FIG. 9B illustrates an example of fibers grown in multiple directions on a substrate, in accordance with one or more aspects of the present invention.

Any of the above described techniques for varying the size, composition, and coatings of the fibers may be utilized in the method as illustrated in FIG. 8. FIG. 9A illustrates an array of fibers (for example as illustrated in FIG. 7). In FIG. 9A, the spacing between fibers is such that neighboring fibers do not occlude lasers during deposition. It can range from twice the diameter of the fibers to the length of the fiber, in some embodiments approximately 100 times the diameter of the fibers. As illustrated, the fibers can each extend perpendicular to a surface of the wafer. However, as illustrated in FIG. 9B, the fibers may be grown at any angle. Thus, the fiber structure can include fibers oriented in a single or in multiple directions relative to the surface of the substrate. The spacing of the fibers can also vary, being arranged in a single or multiple patterns.

Figure 10:
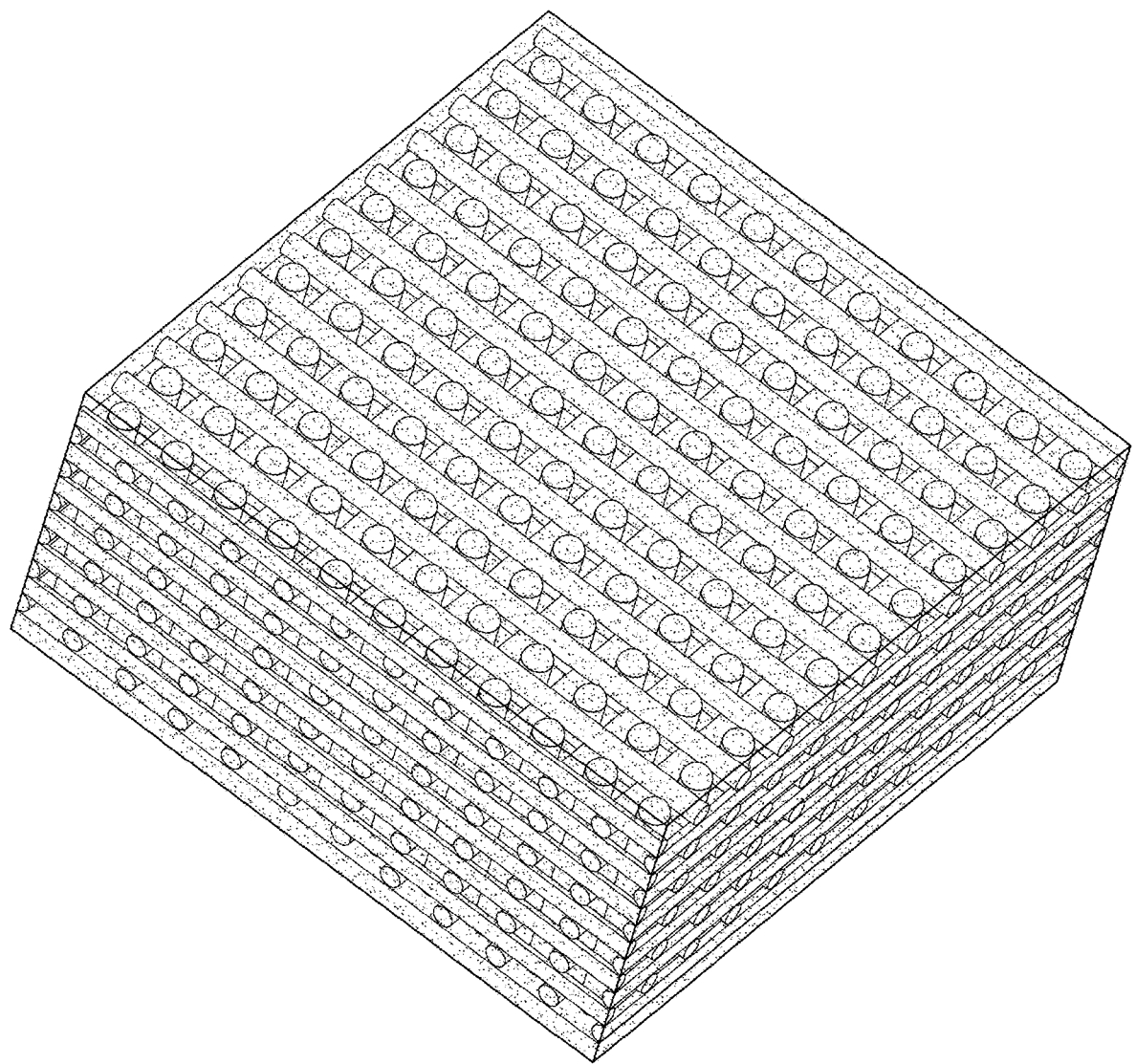
FIG. 10 shows a fiber structure according to aspects of FIG. 8, with the addition of fibers or ribbons between the fibers grown, in accordance with one or more aspects of the present invention.
Figure 11A:
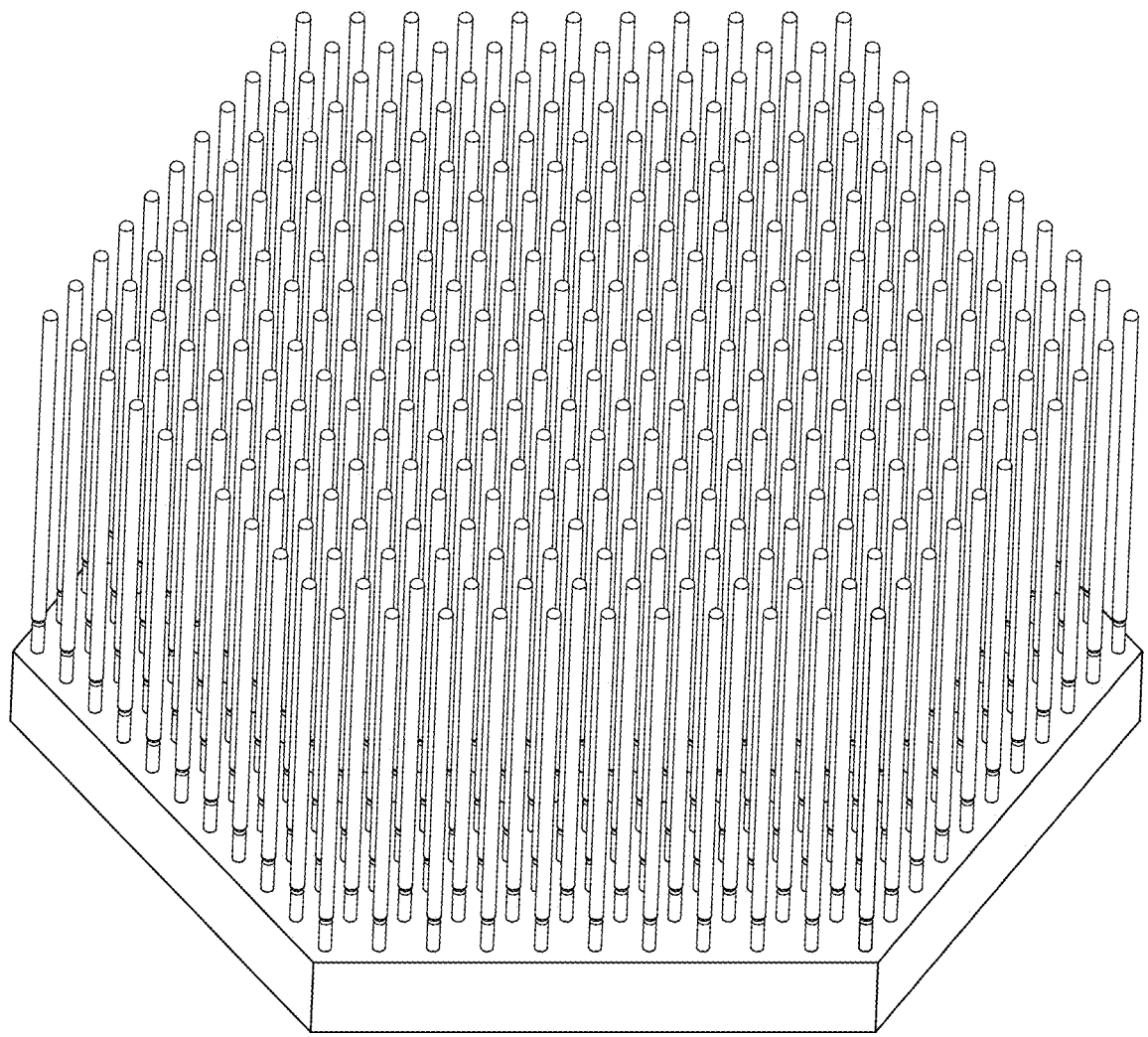
FIG. 11A illustrates a hexagonal array of fibers, in accordance with one or more aspects of the present invention.
Figure 11B:
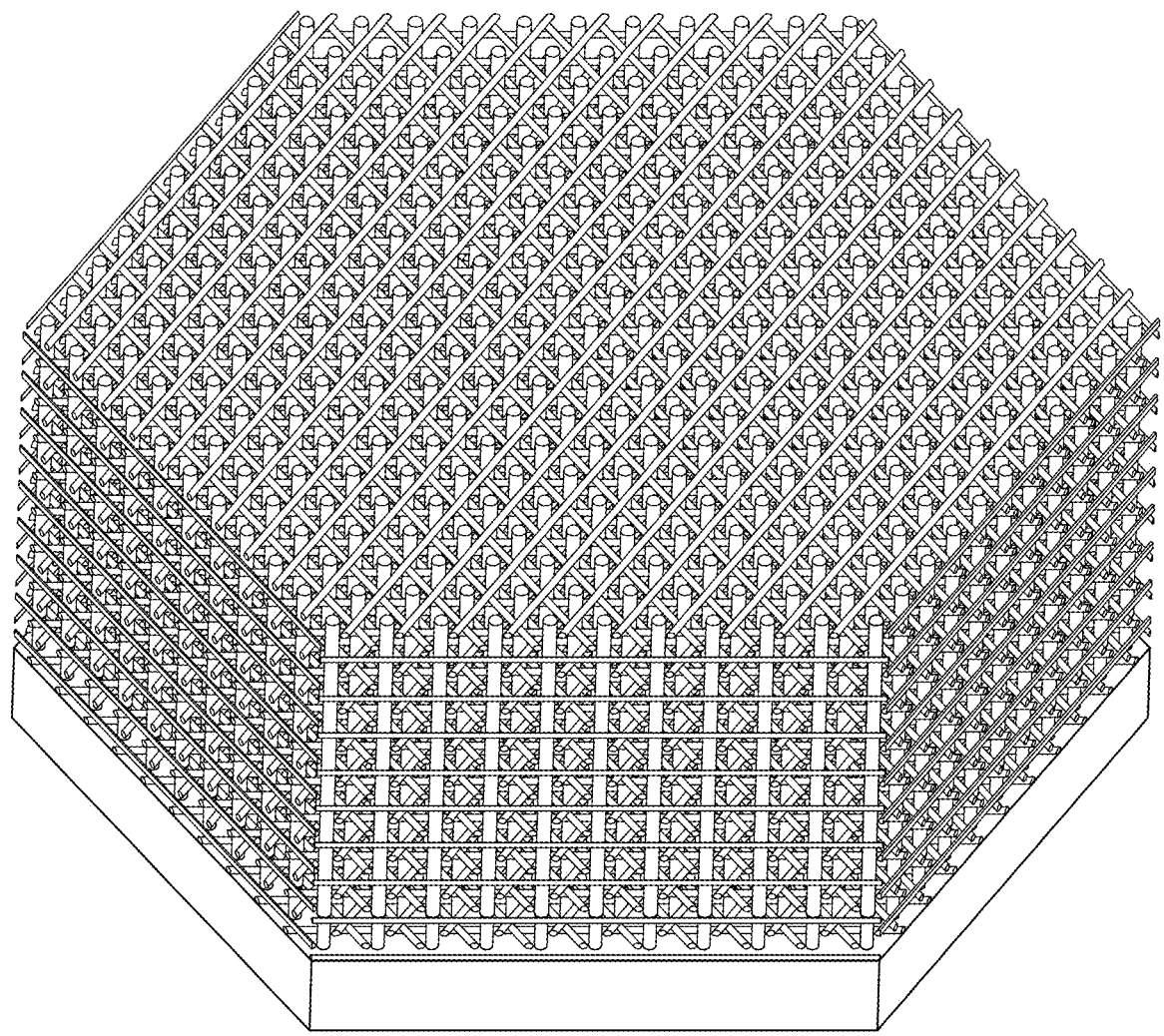
FIG. 11B shows a fiber structure according to aspects of FIG. 11A, with the addition of fibers or ribbons between the fibers grown, in accordance with one or more aspects of the present invention.
Figure 11C:
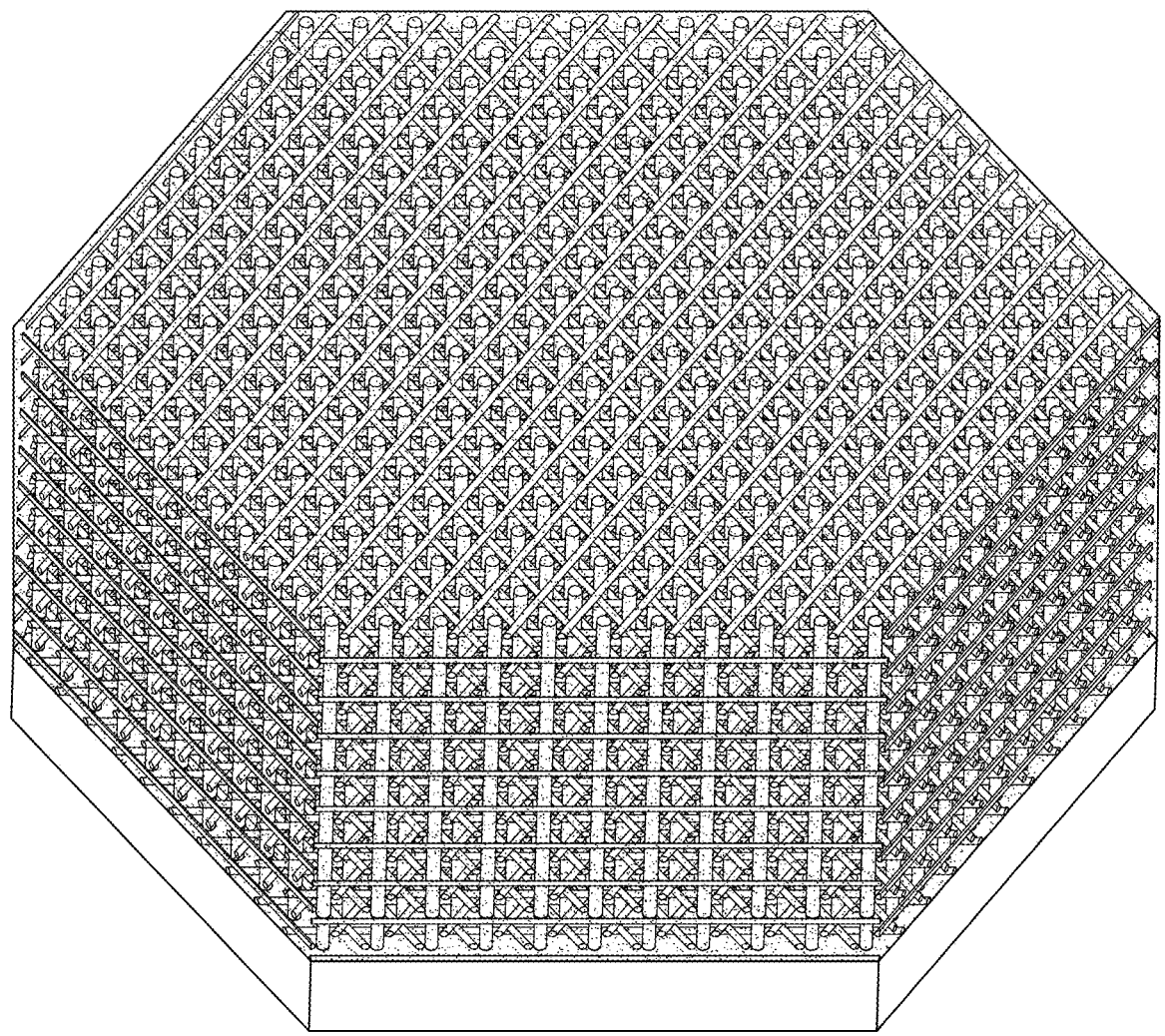
FIG. 11C shows a fiber structure according to aspects of FIG. 11B, with the addition of an embedding matrix.

As illustrated in FIG. 10, once a fiber structure has been grown, and prior to providing the matrix material, the space or some spaces between fibers may be filled with ribbons or fibers, which run in a direction perpendicular to the fibers of the fiber structure, parallel to the surface of the substrate. FIG. 10 illustrates the ribbons or fibers between vertical fibers on a substrate. FIG. 11A illustrates an alternative to FIG. 10, wherein the fibers provide a hexagonal array rather than a square array. FIG. 11B illustrates the ribbons or fibers in a lattice between the fibers for a hexagonal array, with FIG. 11C having a matrix material filled in around the fibers and lattice. The ribbon or fibers can include SiC or other materials at different orientations, for instance at 0-90 or 0, 60, 120, as shown in FIG. 10 and FIG. 11B respectively, which may then be surrounded with a matrix material (FIG. 11C). These ribbons or fibers can act as a network of micro-heat pipes, providing cooling due to the thermal properties of the ribbons or fibers, and can also provide structural reinforcement of the fiber structure, adding strength through the lattice work reinforcing the fiber structure. This 2-D array of refractory fibers may be then surrounded with a refractory matrix, such as SiC, BeO, ZrC, a glass ceramic or a mix thereof for further environmental protection of the fiber structure, and enhancing the structural integrity of the fiber structure. Although illustrated as a square lattice of fiber structure array in FIG. 10, the fiber structure can include any shape, including a hexagonal lattice array as per FIGS. 11A-11C, among others shapes. These arrays may be defined by the shape of the substrate, or there may be multiple arrays defined on the substrate, for instance utilizing some form of isolation, such as deep trench isolation in some embodiments, defining multiple arrays of one or more shapes across a continuous substrate.

The fiber structure illustrated in FIGS. 9A, 9B, 10, and 11A-11C can be useful in high efficiency nuclear fuels and fuel designs, high and ultra-high temperature structural materials, miniaturized or lightweight nuclear thermal propulsion (NTP) solid cores, multifunctional reactor designs, which can allow for integrated health and thermal monitoring as some fiber structures can be designed as sensors as well, and multi-use thermal-electric power. Additionally, sensors, actuators, and other devices can be embedded into the fibers of any fiber structure utilizing the above disclosed methods according to embodiments disclosed therein, for instance, by changing the material of the fibers at any point during the fabrication of the fiber structure, SPOT-COATING, or other methods disclosed above. Multiple types of fibers can be provided in each array, or multiple arrays of different fibers may be utilized. Actuators and/or sensors can be embedded in one or more fibers of one or more arrays, as described above. Thus, vast arrays with multiple uses may be fabricated according to one or more embodiments described above.

CMC, PMC, and MMC Applications

Figure 12:
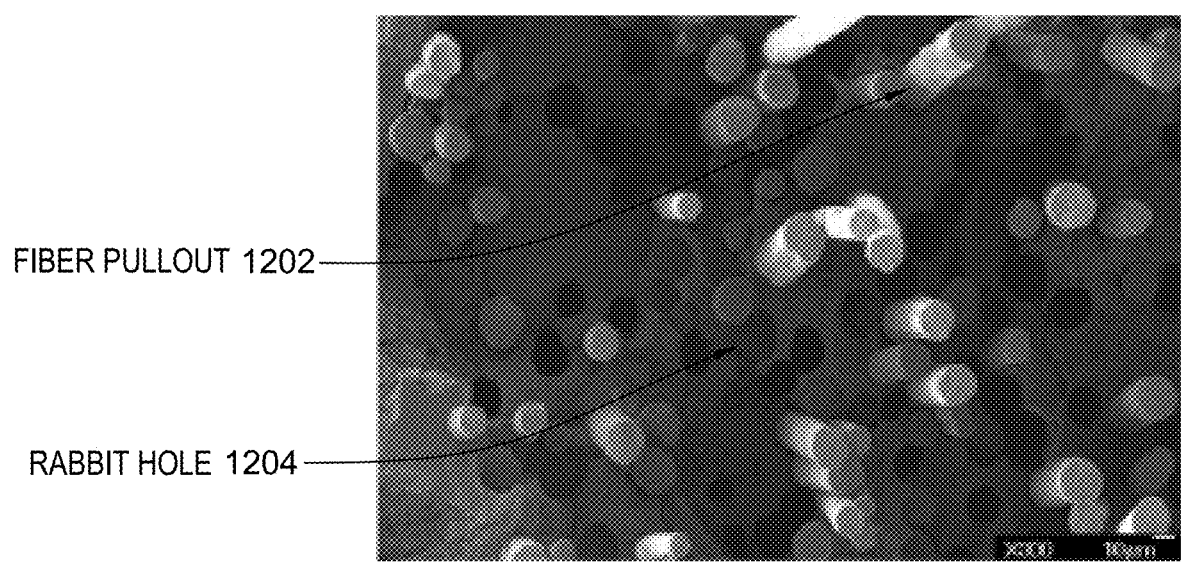
FIG. 12 is a Fractography of a SiCf—SiCf—SiCm CMC fracture surface.

Monolithic SiC, by virtue of being a ceramic material, has very little tolerance to damage. This is where engineered composite materials come in: most prominently Ceramic Matrix Composites (CMC) comprising a Silicon Carbide matrix (SiCm) reinforced with Silicon Carbide fibers (SiCf) (i.e., SiCm—SiCf CMCs). These engineered materials provide drastically increased toughness (10-1000×) compared to their monolithic counterpart. However, compared to more mature composite materials—such as Polymer Matrix Composites (PMC), or Metal Matrix Composites (MMC)—CMCs exhibit a drastically different failure mechanism. Whereas PMCs and MMCs typically fail by delamination and/or fiber rupture while retaining a high level of ductility, CMCs fail through high-density microcracking of the matrix, gradually increasing the load on fibers until they, too, rupture leaving behind the characteristic feature of fiber pullouts 1202 and "rabbit holes" 1204 shown in FIG. 12. The higher the microcracking density, the more energy absorption the CMC presents (known as "resilience"). However, this damage mechanism may not be compatible with the requirement of hermeticity imposed on cladding materials.

Figure 13A:
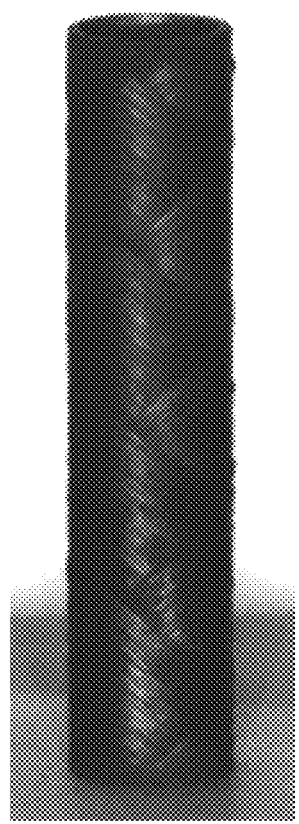
FIGS. 13A-13B show a segment of Triplex cladding, and a cross section of Triplex architecture respectively, showing the composite braid over a monolithic SiC tube intended to contain fuel pellets, and an outer barrier coating is designed to prevent or delay PWR corrosion.
Figure 13B:
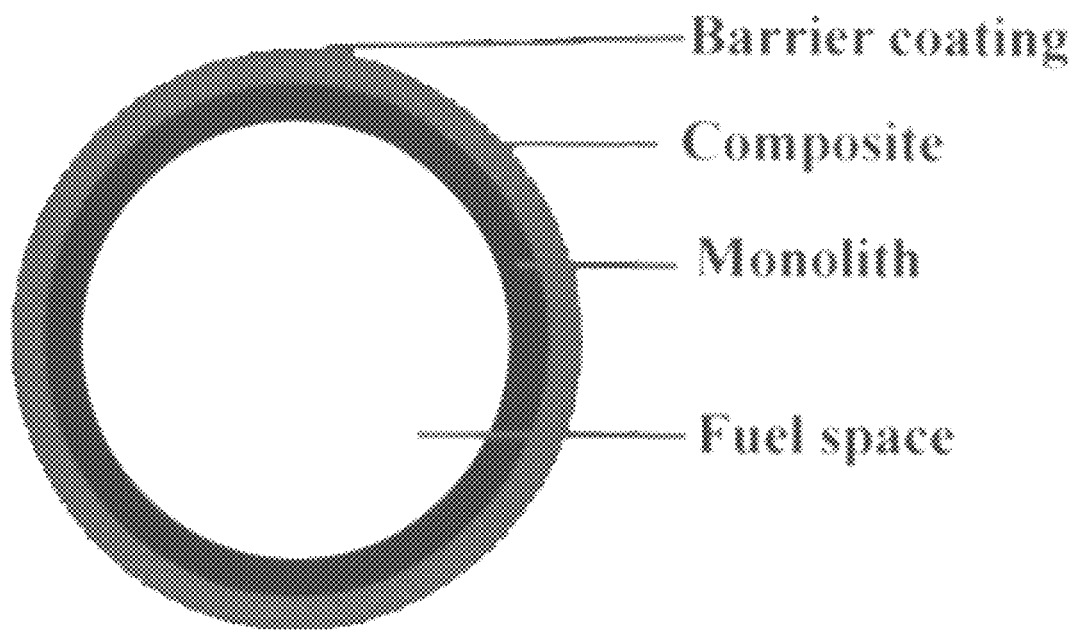

Two mitigation strategies have been developed to address this weakness. The first consists of a hybrid ceramic monolithic-composite consisting of a SiC tubular mandrel around which a SiCm—SiCf CMC is braided. FIGS. 13A-B show a segment of Triplex cladding, and a cross section of Triplex architecture respectively, showing the composite braid over a monolithic SiC tube intended to contain fuel pellets, and an outer barrier coating is designed to prevent or delay PWR corrosion. This particular design is commercialized by Ceramic Tubular Products under the brand name Triplex™. It is made by flattening a SiCf tow and braiding it around a monolithic SiC tube. The Triplex design has been tested extensively. It was found to enhance the flexural strength over monolithic ceramic by about 30% while ensuring fission product retention, heat transfer, and corrosion resistance better than Zircalloy in a loss of cooling (LOCA) accident.

Figure 14:
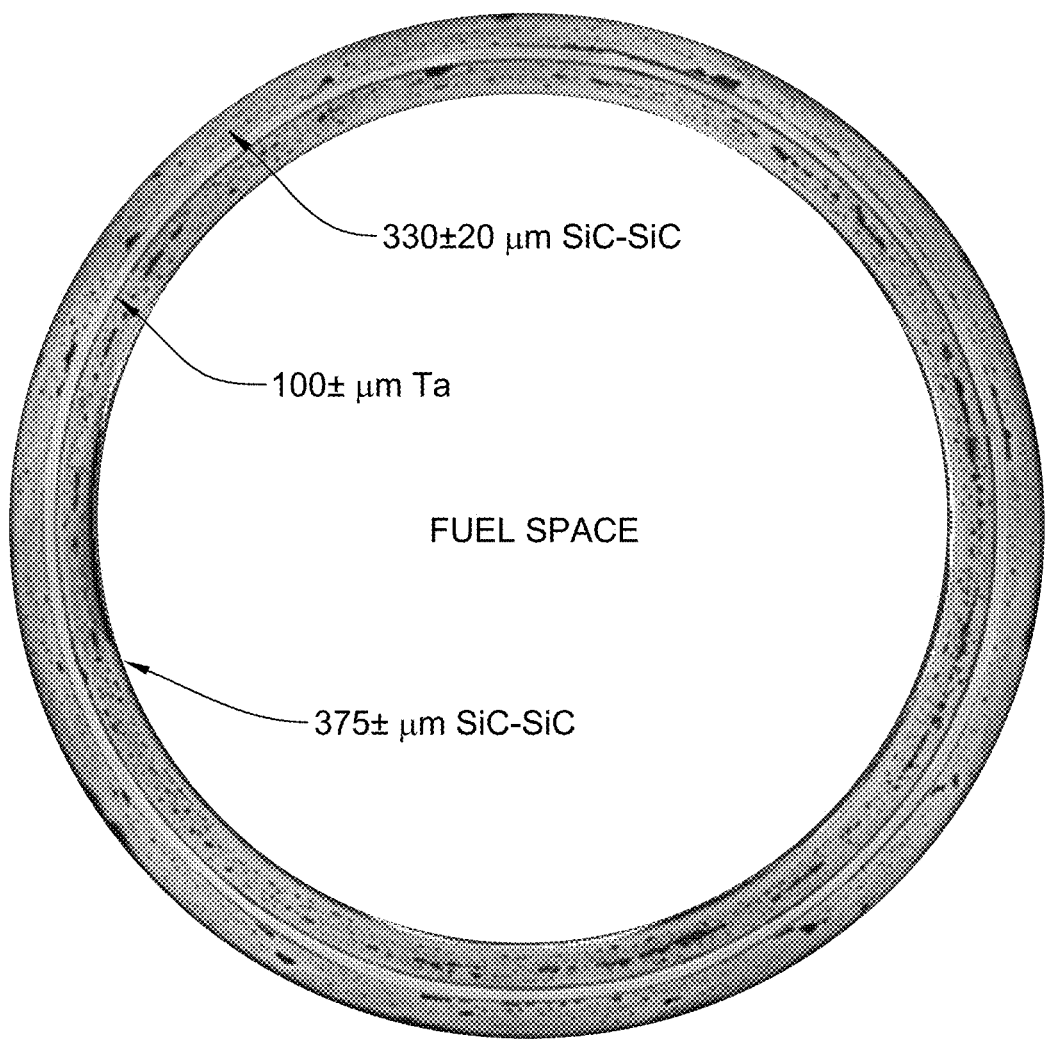
FIG. 14 shows an SiCf—SiCm CMC/Ta/SiCf—SiCm CMC sandwich structure by CEA for accident tolerant cladding.

The second mitigation strategy consists of a hybrid metal—SiCm—SiCf CMC sandwich structure such as represented by a patent awarded to the French Atomic Energy Commission (CEA) and illustrated in FIG. 14, for accident tolerant cladding. In this instance, a foil of recrystallized tantalum is sandwiched between two braided SiCm—SiCf CMC tubes.

Figure 15:
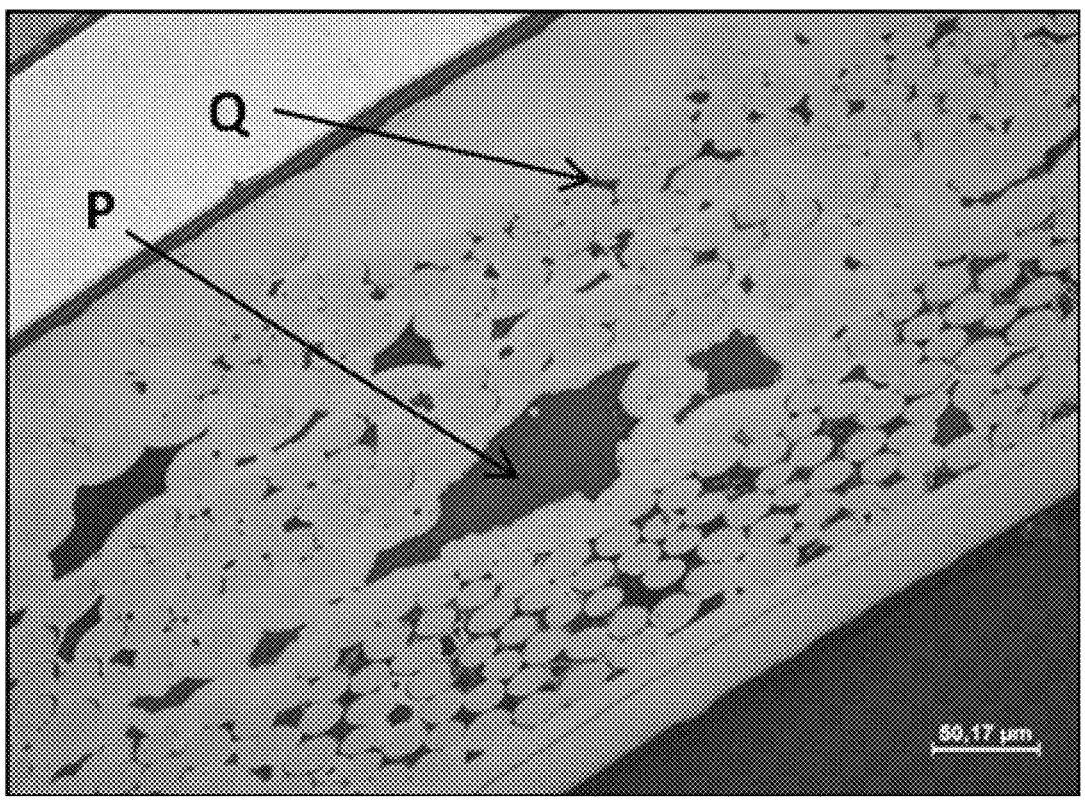
FIG. 15 is an SEM image of a SiCf—SiCm CMC cladding cross-section shown intra-weave (P) and intra-tow (Q) voids.

The critical acknowledgment behind both monolithic ceramic-CMC (Triplex type) and metal-CMC (Sandwich type) design families is that a thin SiCm—SiCf CMC tube alone cannot be relied upon for hermeticity of the cladding (let alone the issue of hermetically capping the tubes). In both instances, additional volume and complexity is taken for the sole requirement of hermetically retaining fission products. Hermeticity is not the only design requirement demanding extra volume. SiCf tows are disorganized bundles of filaments twisted into yarns, thus leaving a significant fraction (20-30% min) of "intra-tow" empty volume. This void fraction is only magnified by braiding or weaving, in which tows cross over each other, adding "intra-weave" empty volume. Though flattening the tow mitigates intra-weave voids somewhat, the problem remains and results in closed porosities in the CMC after matrix infiltration. FIG. 15 is an SEM image of a SiCf—SiCm CMC cladding cross-section shown intra-weave (P) and intra-tow (Q) voids. As shown in FIG. 15, the presence of such voids in CMCs is clearly documented by Duquesne ("Caractérisation thermique de structures composites SiCf/SiC tubulaires pour applications nucléaires. Génie des procédés", Ecole nationale supérieure d'arts et métiers—ENSAM (2015)), and the remarkable X-Ray microtomography work by Bale et al. (H. A. Bale, A. Haboub, A. A. MacDowell, J. R. Nasiatka, D. L. Parkinson, B. N. Cox, D. B. Marshall and R. O. Ritchie, "Real-Time Quantitative Imaging of Failure Events in Materials under Load at Temperatures above 1600° C.", Nature Materials, vol. 12 (1), January 2013, pp. 40-46). Besides weakening the CMC by creating crack initiation sites, these voids also degrade thermal conductivity of the composite. Moreover, in the case of metal-CMC hybrid structures, Duquesne documents detachments of the metal from the ceramic, contributing added conductive heat transfer resistance. Yet, these manufacturing-induced defects are only the tip of the iceberg. The tribology of SiC is such that tow flattening and weaving or braiding are incredibly damaging to the tow strength, taking a toll in excess of 50%. This induced weakness can only be compensated by making the CMC thicker, further taxing heat transfer and volume available for fuel, and driving up the cost of CVI matrix infiltration beyond acceptable economics. In light of recent testing as well, it would appear the Triplex-type heavy reliance on monolithic ceramics makes the design vulnerable to seismic code requirements, which requires strain to failure in excess of 0.07%.

The present invention offers a practical and inventive solution to the fabrication of MMC-CMC hybrid composites. This invention opens opportunities that extend well beyond nuclear cladding, for example hypersonics or jet engines and gas turbines capable of operating above 1500° C. This temperature threshold is highly desired by jet engine designers for two reasons: (1) A turbine engine operating at this temperature would of course exhibit a higher thermodynamic efficiency; but more importantly (2) would obviate the need for a cooling system—a drastic weight reduction for aerospace applications. And regarding the nuclear cladding interest, disclosed is a strength-equivalent hybrid MMC-CMC with 1/10th the thickness of a Triplex-type cladding, with none of the delamination issues of metal-CMC, no tow related defects, no weave or braid, and the potential for an order of magnitude increase in thermal conductivity. Of course, the much thinner thickness also means much lower CVI matrix costs.

Figure 16:
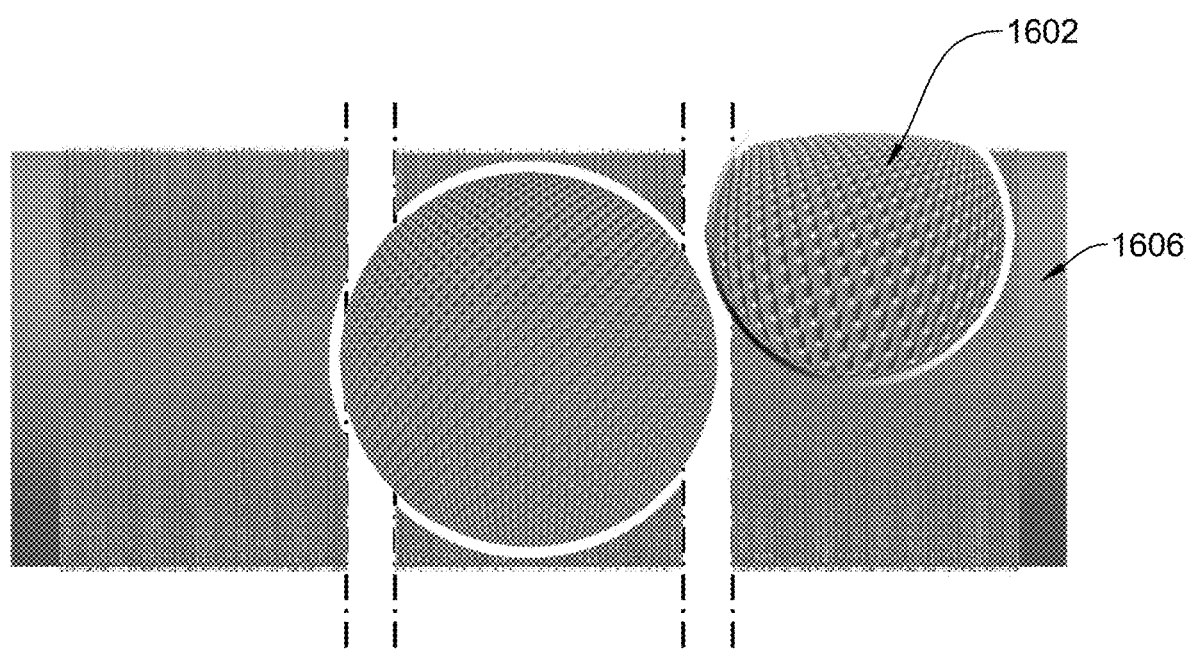
FIG. 16 depicts a long cylindrical mandrel on which is deposited a fiber forest with square lattice helical pattern, with the insets showing a magnified view of the fiber forest, in accordance with one or more aspects of the present invention.

FIG. 16 shows successive views, with magnified insets, of a cylindrical mandrel on which is deposited a fiber forest with square lattice helical pattern, in accordance with one or more aspects of the present invention. The resultant spiny body can be referred to as a "porcupine" and each standing or short fiber a "spike" 1602.

Consider a long cylindrical mandrel representative of a cladding tube inner diameter. Such a mandrel can be expendable (to be burnt off at the end of the process) or support, for example, a thin (possibly flexible) metallic foil 1606 (e.g. Ta or Zr) in accordance with the present invention. On this mandrel is implanted a very large array of short (250-500 μm) radial SiC fibers 1602 along helical patterns at ±45° angles, as shown in FIG. 16.

Figure 17A:
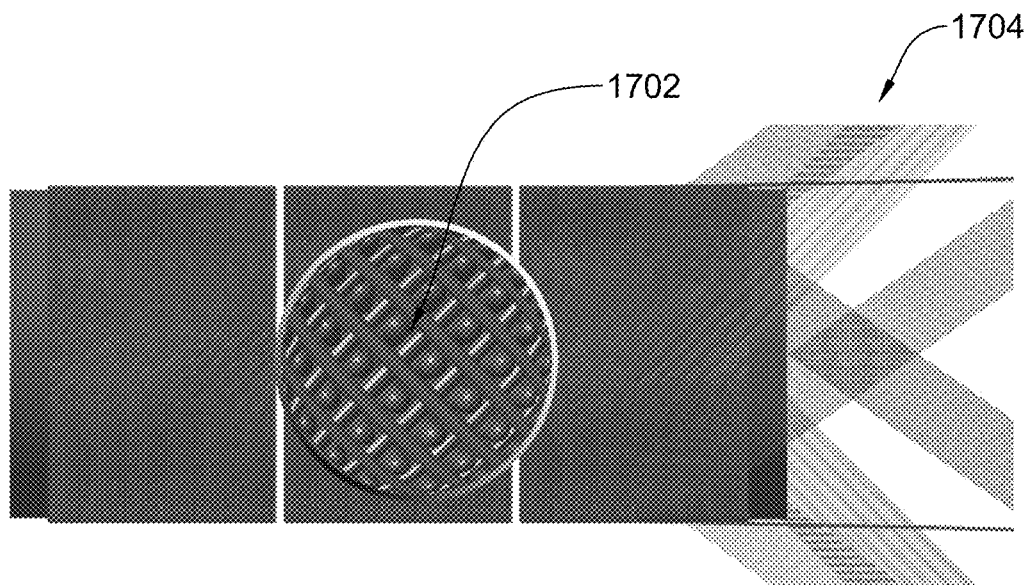
FIG. 17A is a broken view, while the last layer of four with eight 50-filament ribbons is being wound around a square pattern fiber porcupine/forest, with an inset magnified radial view of the resulting layup (center), in accordance with one or more aspects of the present invention, with an edge view of the winding seen in FIG. 18.
Figure 17B:
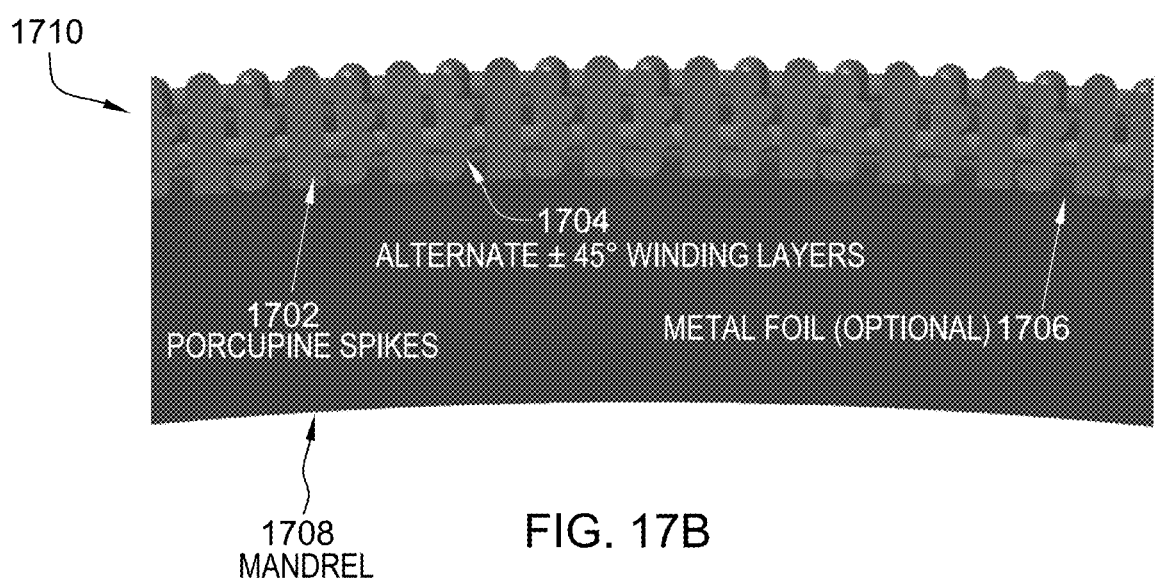
FIG. 17B is a radial cross-section of the resulting μ-trellis from FIG. 17A, showing the fiber forest with 4 layers of ribbon windings, in accordance with one or more aspects of the present invention.

Each of the helical tracks at ±45° can then be used to guide the winding of a continuous SiC fiber. FIGS. 17A-B show ribbons of multiple continuous fibers 1704 being wound in parallel (the reason for this particular choice will become evident in the next section). FIG. 17A is a broken view while the last layer of four with eight 50-filament ribbons 1704 is being wound around a square pattern fiber porcupine/forest of spikes 1702, with an inset magnified radial view of the resulting layup (center), in accordance with one or more aspects of the present invention (with an edge view of the winding seen in FIG. 18). FIG. 17B is a radial cross-section of the resulting μ-trellis 1710 from FIG. 17A, showing the fiber forest with 4 layers of ribbon windings 1704, in accordance with one or more aspects of the present invention. Mandrel 1708 is shown, as is an optional (possibly flexible) metal foil 1706, in accordance with an aspect of the present invention. The result is a uniform non-woven 3-D fiber architecture, which can be referred to as a "microtrellis" (μ-trellis) 1710.

Figure 18A:
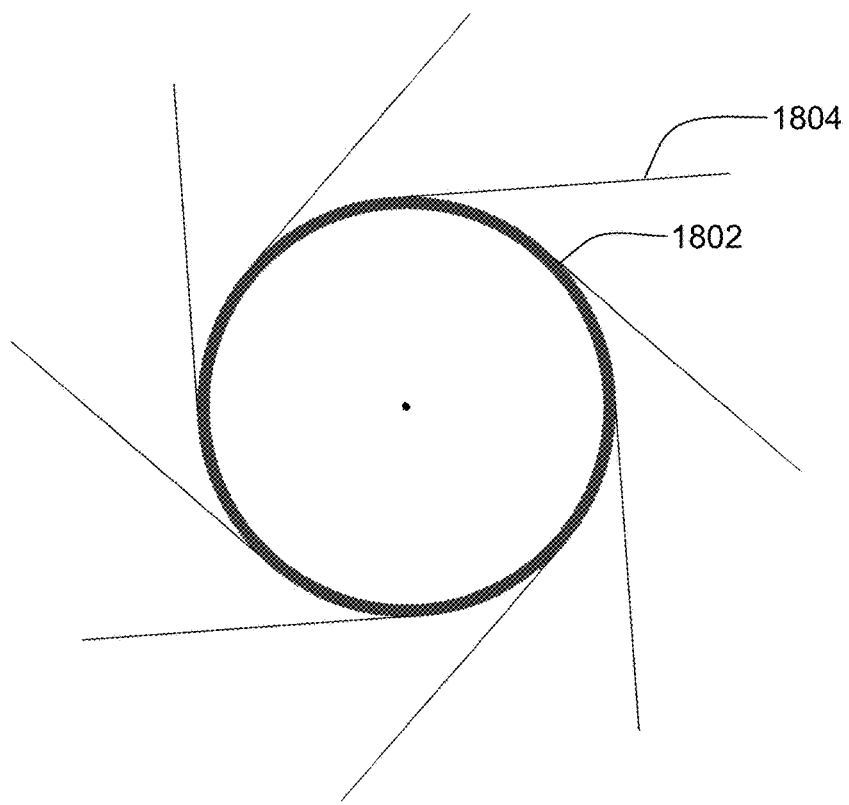
FIG. 18A shows the helical winding of FIG. 17A down the mandrel axis, in accordance with one or more aspects of the present invention.
Figure 18B:
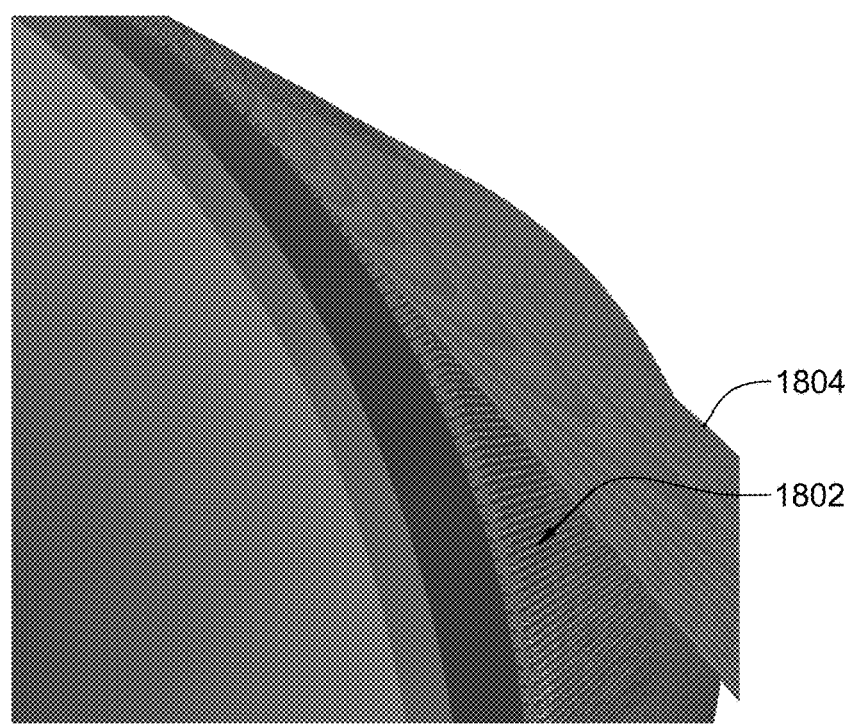
FIG. 18B shows a perspective view of an instance of a kinematic simulation of the helical winding of a 50 filament ribbon over a square patterned fiber forest, in accordance with one or more aspects of the present invention.

FIG. 18A shows the helical winding of FIG. 17A down the mandrel axis, in accordance with one or more aspects of the present invention, and FIG. 18B shows a perspective view of an instance of a kinematic simulation of the helical winding of a 50 filament ribbon over a square patterned fiber forest, in accordance with one or more aspects of the present invention.

More particularly, FIG. 18A shows an end-view of eight 50-filament ribbons 1804 being wrapped around the porcupine. FIG. 18B is an instance of this simulation showing the filaments inserting themselves neatly between the porcupine spikes 1802. To exhibit a composite behavior, the μ-trellis architecture may be coated with a thin layer (~100 nm) called "interphase" (typically PyC, BN, or BeO—as disclosed in US Patent Publication 2018/0087214 A1 which published Mar. 29, 2018 entitled Refractory Oxide Coated Fiber and Method of Making," and which is hereby incorporated by reference herein in its entirety) that preserves the identity of the fibers. For reasons that will become clear in the next section, this need not be a separate fabrication step as fibers can be made directly pre-coated with interphase (as disclosed in US Patent Publication US 2019/0062222 A1 which published Feb. 28, 2019 entitled "High Strength Ceramic Fibers and Methods Of Fabrication," and which is hereby incorporated by reference herein in its entirety). To complete the CMC, a SiC matrix is may be created by CVI. The result can be either an ultrathin CMC shell if the expendable mandrel is used as substrate for the porcupine spikes, or a hybrid MMC-CMC if the porcupine spikes are implanted in a (possibly flexible) metallic foil (e.g. Ta or Zr).

Fiber Laser Printer (FLP) and Fiber Forest Generator (FFG) Applicability

The present invention also builds upon dual technological innovations generally discussed above with respect to FIGS. 1-4 and FIGS. 8-11 respectively. The first area—the Fiber Laser Printer (FLP) is the subject of the above-incorporated publications entitled "High Strength Ceramic Fibers and Methods of Fabrication." The second, and more recent, innovation is the Fiber Forest Generator (FFG) which is the subject of the above-incorporated publications entitled ""Functional High-Performance Fiber Structure." Both innovations rely on the same principle of Rapid Laser-Induced Chemical Vapor Deposition (R-LCVD) using a laser each per fiber.

Figure 19:
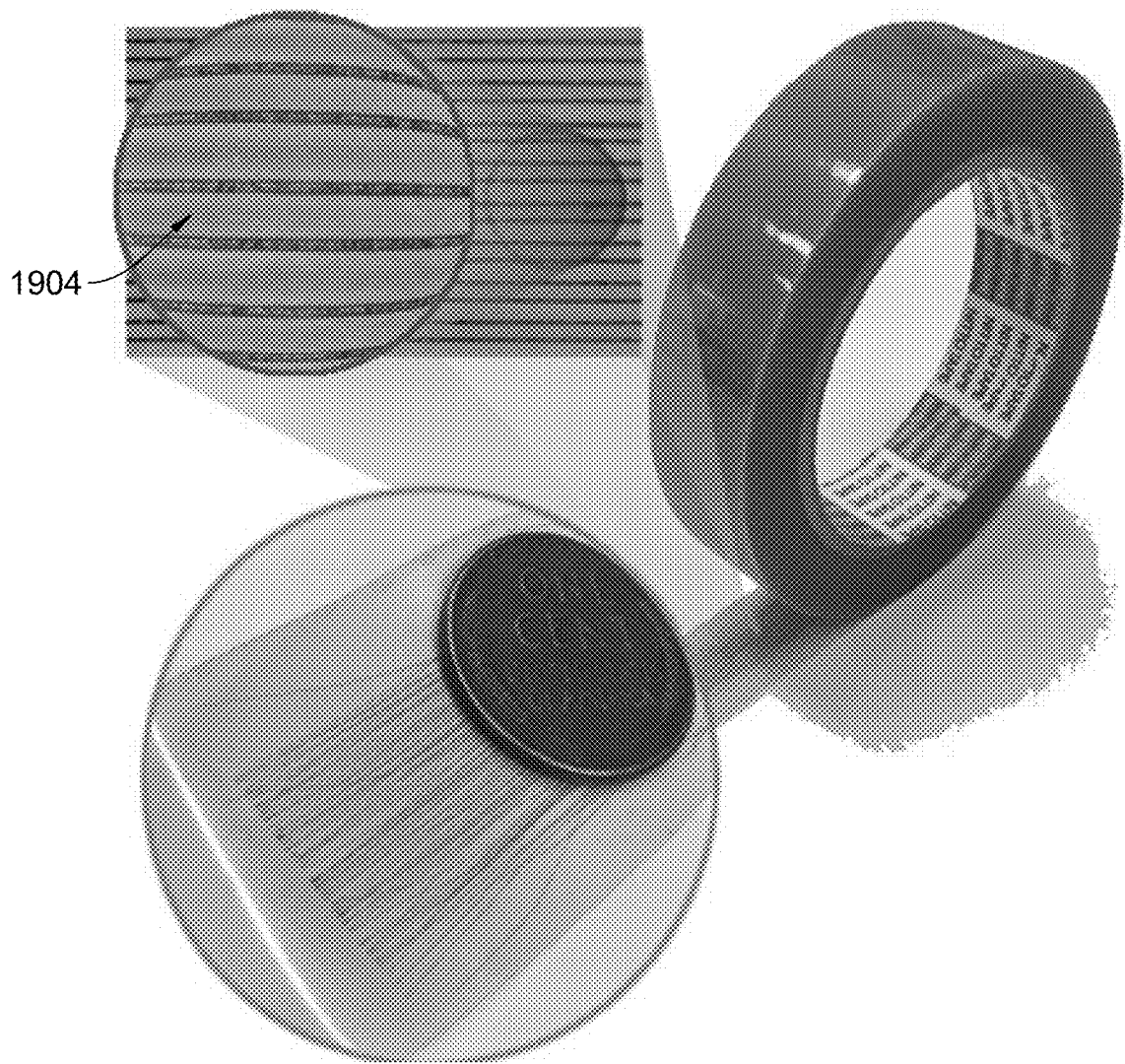
FIG. 19 shows ribbon packaging of Laser-Printed SiC fiber (64 filament count—22 μm) collected on heat release tape (e.g., Nitto-Denko, Japan) with a US Penny for scale, where the top inset is a magnification of rectangular detail showing the ribbon of parallel continuous SiC filaments as printed, in accordance with one or more aspects of the present invention.

In the former (FLP), fibers are self-seeded and the product is a continuous ribbon of identical straight filaments, parallel to each other. FIG. 19 shows ribbon packaging of Laser-Printed SiC fiber (64 filament count—22 μm) collected on heat release tape (e.g., Nitto-Denko, Japan) with a US Penny for scale, where the top inset is a magnification of rectangular detail showing the ribbon 1904 of parallel continuous SiC filaments as printed, in accordance with one or more aspects of the present invention. FIG. 19 shows the ribbon comprising 64 filaments collected on a heat release tape. The FLP can attain fiber counts in the hundreds.

Figure 20A:
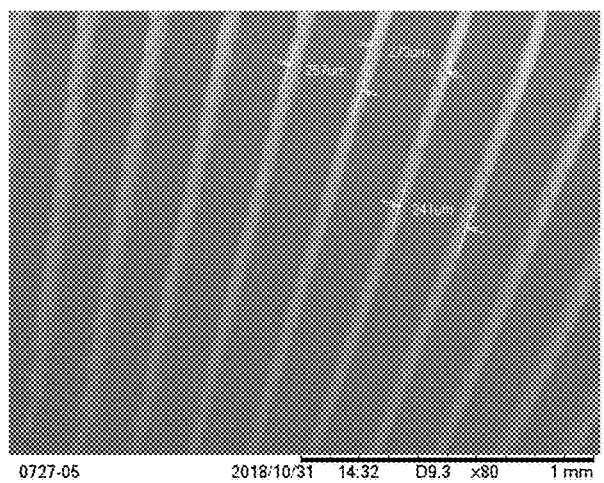
FIGS. 20A-20C are SEM images of a large array of SiC fiber forests on a glassy carbon substrate at increasing magnifications, respectively, in accordance with one or more aspects of the present invention.
Figure 20B:
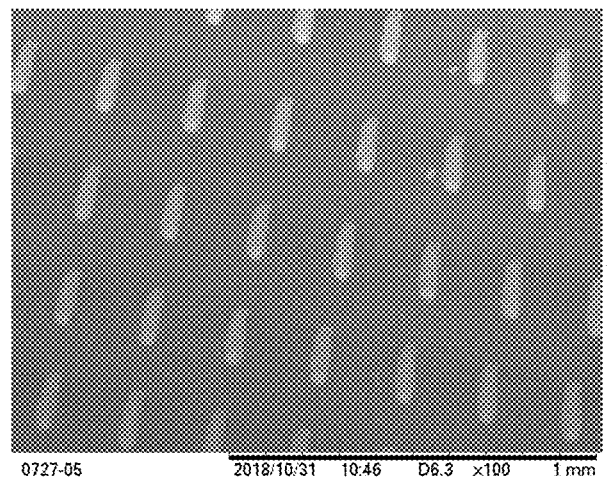
Figure 20C:
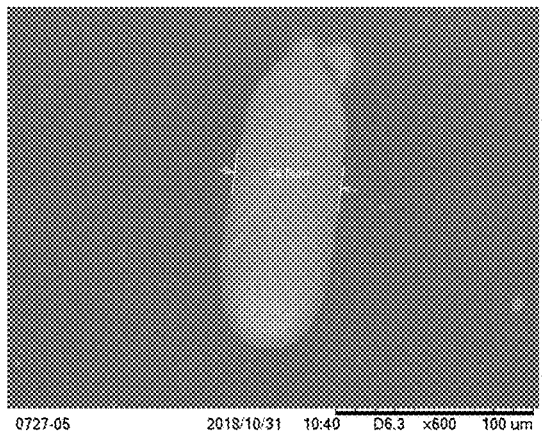

In the latter (FFG), fibers are seeded on a flat substrate, resulting in a massive array of anchored freestanding short filaments, as seen in FIGS. 20A-C, which are SEM images of a large array of SiC fiber forests on a glassy carbon substrate at increasing magnifications, respectively, in accordance with one or more aspects of the present invention.

Fiber Laser Printer™ (FLP)

The FLP offers an extremely versatile approach to the production of inorganic filaments. It is nearly independent of the fiber's material; a rare property among manufacturing processes, which is referred to as "Material-Agnostic". For example, the FLP has been applied to the demonstration of filaments for which no other manufacturing method is known: boron carbide; boron; tungsten carbide (with exceptional hardness of 27-29 GPa); and tertiary Si—C—B fibers (with exceptional tensile strength of 9 GPa). The assignee has demonstrated that it was possible to produce fibers with varying composition functionally graded along their axis. As further demonstration of the material-agnostic qualities of the FLP, the assignee demonstrated that it is possible to vary fiber composition and the radial distribution of microstructure. For example, the assignee has demonstrated the ability to customize SiCf microstructure distribution, with distributions ranging from (1) elongated anisotropic grains at the fiber center morphing into equiaxed fine grains at the fibers edge to (2) uniform microstructure across the fiber.

The assignee has also demonstrated that fibers can be coated in the FLP as fibers are being produced; a first in the industry. Interphases of Boron Nitride or Pyrolytic Carbon (PyC), with an added SiC overcoat have been deposited. Such coatings were shown feasible within a large dimensional window ranging from 10's of nanometers (nm) to ~10 µm. This is a valuable feature of the FLP as (1) interphase coating is required for the material to exhibit composite behavior; and (2) there still are no satisfactory solutions to produce a uniform pre-coating of fibers in tows and fabrics. The current state of the art with commercial SiCf tows (HNS, SA3) consists of depositing an interphase, just prior to matrix infiltration; a cumbersome and onerous process that yields many defects.

The FLP also exhibits unparalleled flexibility in the geometric realm as well. As part of a DOE-funded effort, the assignee has demonstrated that diameter can be controlled at will during fiber growth, leading to the first demonstration of variable diameter SiCf.

Regarding the nuclear application, the extreme flexibility of this process is allowing a tailoring of the composition to the application. Fibers with uniform microstructure and different stoichiometries were tested at Oak Ridge National Laboratories (ORNL) in thermal creep for 1 hour at 1500° C. and 1700° C. using the Bending Stress Relaxation (BSR) technique. For fibers with radially graded microstructures—to which the BRS does not apply—FFF has designed and built a pure tensile creep test unit. The first results of a characterization campaign comparing the creep behavior of commercial and the assignee's SiCf, in Air and in Argon, for 170 h at 1500° C. and under 700 MPa of tensile stress were recently presented at a conference. The main takeaway from both ORNL and the assignee's measurements is the excellent creep resistance exhibited by the assignee's laser printed SiCf. In contrast, FINS' strength decreases so rapidly past 1400° C. that no creep test could be completed due to fiber failure (a decrease of 70-90% from Room Temperature (RT) tensile strength). The longest any HNS fiber withstood the test was 78 h. For comparison, the tensile strength of the assignee's laser printed SiCf measured at 1500° C. (after 170 hours of exposure without fiber failure) registered only a 40% drop from RT, consistent with published data on SiC.

Fiber Forest Generator (FFG)

Figure 21:
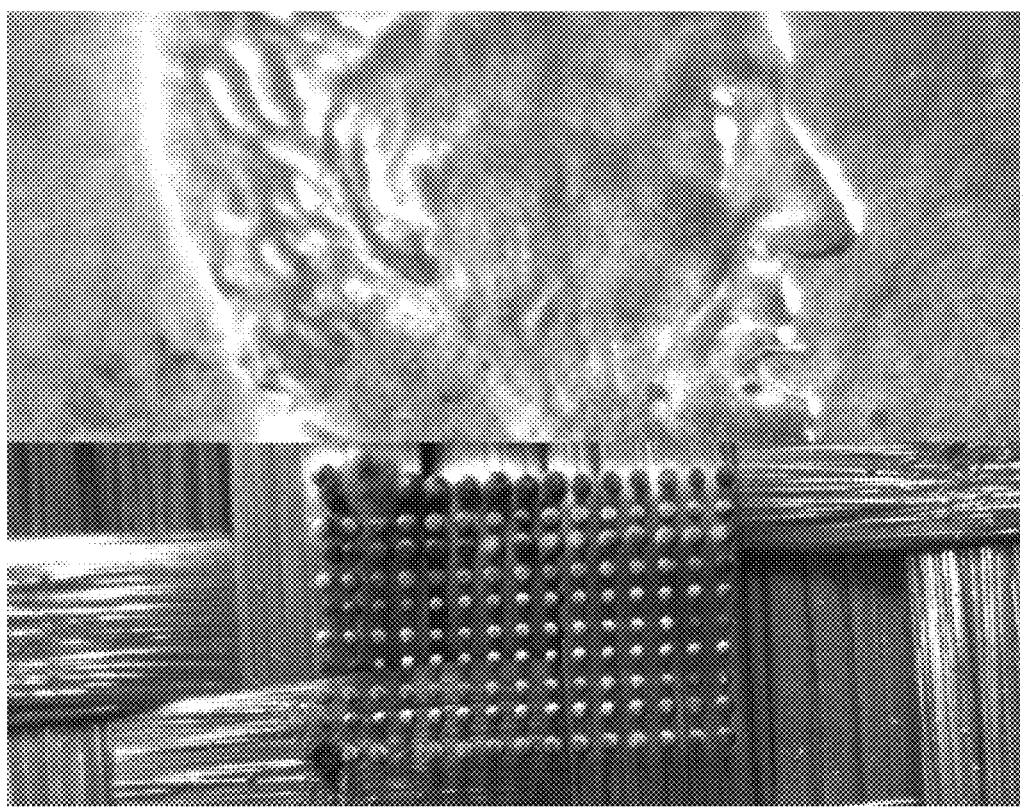
FIG. 21 shows an SiC fiber forest grown on HNS tow SiC fabric, in accordance with one or more aspects of the present invention.

The FFG can be analogized to an FLP turned perpendicular to the surface of a substrate. Doing so generates arrays of short freestanding fibers, up to ~¼" long, as shown in FIGS. 20A-C, which are SEM images of a large array of SiC fiber forests on a glassy carbon substrate at increasing magnifications, respectively, in accordance with one or more aspects of the present invention. Fiber composition and microstructure is inherited from the FLP. Of particular interest to this invention, fiber forests have been grown on a range of substrates. FIG. 21 shows a rectangular array of SiC fibers grown atop a woven HNS fabric. The present inventors now believe these processes can be used to grow fibers on a wide variety of substrates, as has been done on a business card for example.

The main point of FIG. 21 is to show how tightly packed a fiber forest can be. Experiments growing carbon fibers on Tantalum wire were also conducted: First, growth was easy to initiate, but more importantly the fibers were strongly attached to the substrate. In other instances (e.g. growing beta-SiC onto single crystal alpha SiC) fibers will grow but exhibit weak bonding. Both strong and weak bonding are of interest in the present invention. Strong bonding to a metallic substrate will physically support MMC-CMC cohesion, whereas a weak bond might be desirable if only a CMC is desired.

"Fabric" Applications

The nuclear cladding application described in connection with FIGS. 5-7 above may represent the ultimate challenge addressed by this invention. There are, however, more modest applications with benefits in terms of technology development and accelerated commercial returns. Indeed, rather than designing tubular structures, the present invention involves non-woven fabrics, their feasibility and their properties. Properties that are critical to the success of CMCs and hybrid MMC-CMC's made from such non-woven fabrics are discussed below.

Having disclosed: (1) ribbons of evenly spaced continuous filaments (FIG. 19) and (2) massive arrays of freestanding short fibers (FIG. 20), the present invention in once aspect is directed to a method of creating a three-dimensional non-woven fabric, and the resultant product itself. Assuming straight fibers—and ignoring the trivial unidirectional layup—two layup architectures are generally allowed by the symmetry group in the plane: square and hexagonal, which are usually referred to respectively as "0-90" and "0-60" in composite jargon. They are graphically compared in FIGS. 22A-24B. As discussed primarily herein square and hexagonal layups will be the most common, but other geometries are possible which fall into the scope of the present invention.

Figure 22A:
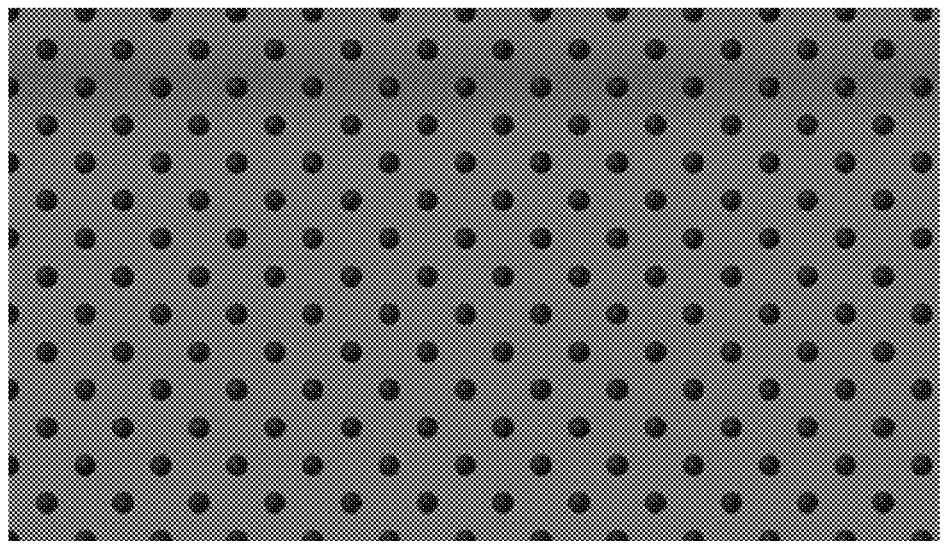
FIGS. 22A-22C show a square fiber lattice architecture buildup, including a (A) top view of a fiber forest scaffold needed for a square layout with identical fiber diameters and pitches, (B) top view of corresponding in-plane fiber layup (green), and (C) edge views of 15-ply square layup (identical fiber cross-section normal to the fiber's axis), in accordance with one or more aspects of the present invention.
Figure 22B:
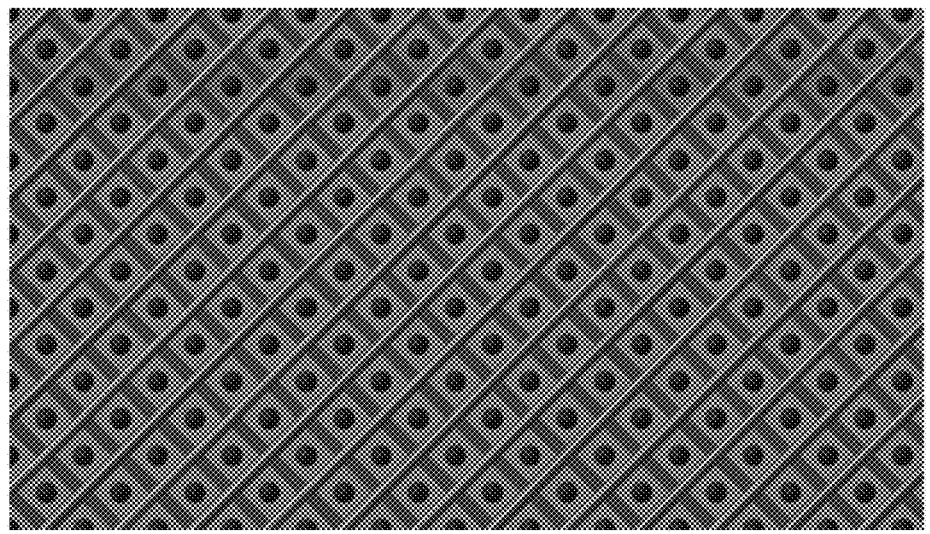
Figure 22C:

FIGS. 22A-22C show a square fiber lattice architecture buildup, including a (A) top view of a fiber forest scaffold needed for a square layout with identical fiber diameters and pitches, (B) top view of corresponding in-plane fiber layup (green), and (C) edge views of 15-ply square layup (identical fiber cross-section normal to the fiber's axis), in accordance with one or more aspects of the present invention.

Figure 23A:
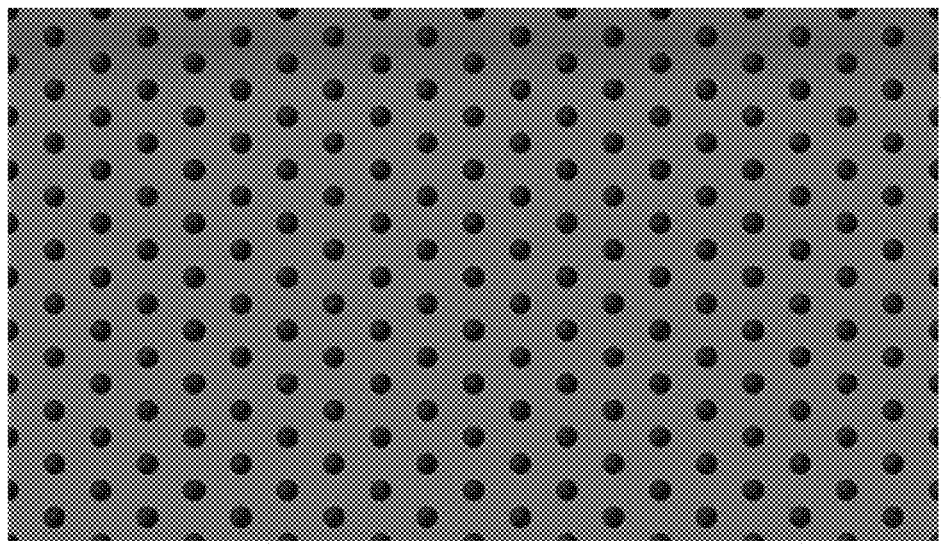
FIGS. 23A-23C show a hexagonal fiber lattice architecture buildup, including a (A) top view of a fiber forest scaffold needed for and hexagonal layout with identical fiber diameters and pitches, (B) top view of corresponding in-plane fiber layup (green), and (C) edge view of 18-ply hex layups (identical fiber cross-section normal to the fiber's axis), in accordance with one or more aspects of the present invention.
Figure 23B:
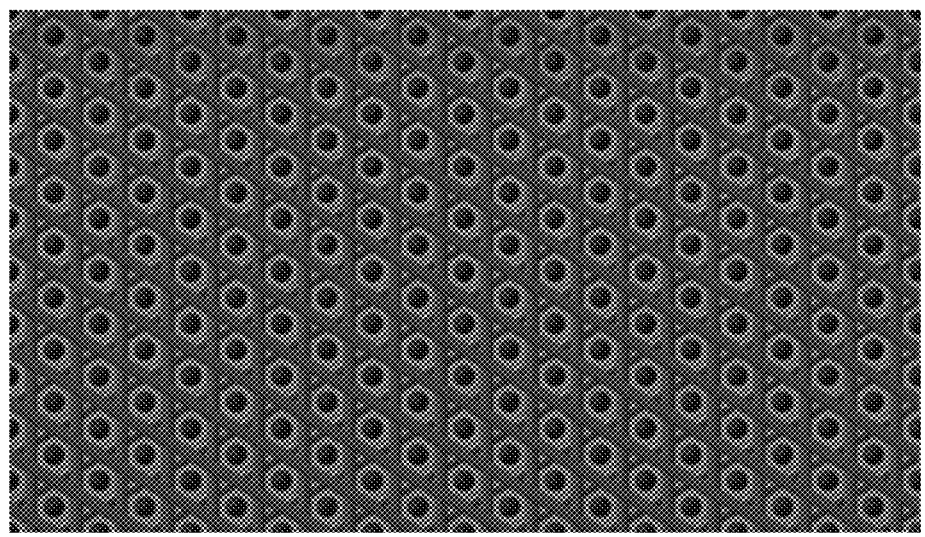
Figure 23C:
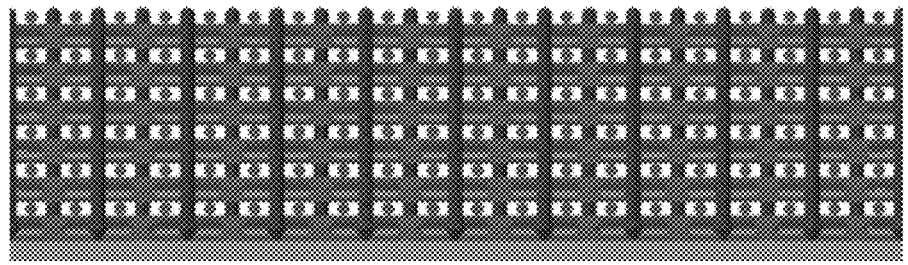

FIGS. 23A-23C show a hexagonal fiber lattice architecture buildup, including a (A) top view of a fiber forest scaffold needed for and hexagonal layout with identical fiber diameters and pitches, (B) top view of corresponding in-plane fiber layup (green), and (C) edge view of 18-ply hexagonal layups (identical fiber cross-section normal to the fiber's axis), in accordance with one or more aspects of the present invention.

Figures 24A, 24B:
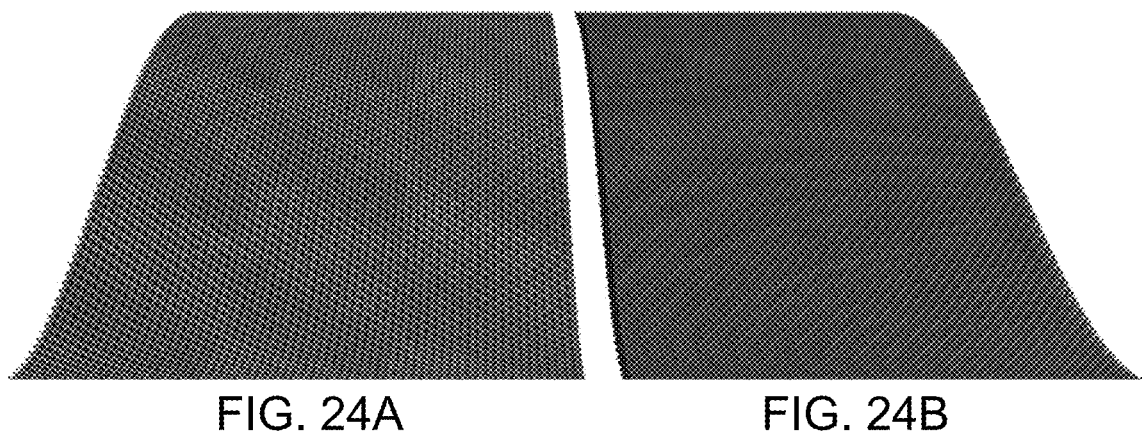
FIGS. 24A-24B show a μ-trellis fabric formed with the square and hex architectures of FIGS. 22A-23C, respectively, in accordance with one or more aspects of the present invention.

FIGS. 24A-24B show apt-trellis fabric formed with the square and hex architectures of FIGS. 22A-22C and 23A-23C, respectively, in accordance with one or more aspects of the present invention.

It can be shown by a geometric analysis that the maximum fiber volume fractions achievable for identical fiber diameters (ribbon and forest) are 58.90% and 55.86% for the square and hexagonal (hex) layups respectively. The fiber volume fractions are split 39.27%-19.64% and 33.19%-22.67% between ribbons and forests for the square and hex layups respectively. These differences are clearly visible in FIGS. 22A-24B, which contrast equal fiber cross-sectional surfaces for the two architectures, with equal fiber diameter and pitch. FIGS. 22A and 23A clearly show a thinner density for the "square" fiber forest (FIG. 22A) versus the hex (FIG. 23A). Conversely, the edge views at the bottom of FIGS. 22C and 23C show that in-plane continuous fibers are more densely packed in the case of a square layup (FIG. 22C) than the hex (FIG. 23C). Hence, the 15-ply square layup would have equivalent tensile strength along its principal directions as the 18-ply hex layup. Alternatively, if thermal conductivity across the shell is driving the design, then a Hex pattern should be slightly superior.

The volume fraction of in-plane fibers alone (39.3% and 33.2% for square and hex respectively) are comparable to those typically found in commercial SiC—SiC CMC's made from woven or braided SiCf tows. However, fiber volume fraction alone is not an objective measure of structural performance. Laser printed SiCf exhibits diameters that are adjustable between 14 µm and ~60 µm and tensile strengths ranging from 3-7 GPa depending on composition. Commercial SiCf tows, such as HNS, in contrast are composed of discontinuous 14 µm individual filaments twisted into a thread with a published aggregate tensile strength of 2.8 GPa. The tightest filament packing physically possible within a tow would be a hexagonal arrangement, in which case the filament volume fraction within a tow would be 90.7% (or $\pi/2\sqrt{3}$). An intra-tow packing density at the theoretical limit is impractical however. Any inter-filament degree of freedom would vanish, turning the tow into a nearly solid SiC rod. Even square packing corresponding to a filament volume fraction within the tow of 78.5% (or $\pi/4$)—is highly improbable. Braiding or weaving introduce additional inter-tow voids, which, depending on the weaving or braiding pattern, further degrade filament volume fraction to levels of 30-40% or less. Accounting for all these factors, a single ø30 µm laser printed SiC filament in the proposed fiber architectures (FIGS. 22A-23C) is the structural equivalent of a ø60-90 µm HNS tow.

More critical even than fiber volume fraction, braiding and weaving are known to impart severe damages to the tow. The point where one tow passes over another is a stress riser that initiates the cracking of fibers and limits the overall strength of the composite. In the art, the PI derives the Hertzian contact pressure between two filaments as a function of contact angle and load. It is shown that a load as little as 1 mN applied between two 15 µm SiC fibers (350-400 GPa of Young's Modulus), crossing at 90°, is more than enough to break the fibers. Such a load is easily reached from bending the tow in a weaving pattern like the one in the background of FIG. 21. Therefore, eliminating the fiber cross-over can be expected to dramatically increase the overall strength of the composite. In other words, the proposed architectures of FIGS. 22A-24B can potentially decrease the thickness of a CMC shell structure by a factor 2-3 while preserving structural strength.

Regarding structural strength, it is known that interlaminar shear in composites is in direct proportion to the interlayer distance. This has led large players in the composite industry to push toward untangling tows to squish them into thin ribbons. The FLP surpasses this goal for free, achieving the ultimate limit of single fiber thick layer. It is therefore legitimate to surmise that the proposed architecture will provide additional resistance to delamination, even before accounting for the fiber forest.

The introduction of the Fiber Forest of the present invention can be compared to the technique of Z-Pinning, but much improved. Z-Pinning is typically used to join composite structures or provide a means of interlaminar shear abatement. It is accomplished by forcing a needle or a thick fiber through multiple layers of fabric prior to matrix infiltration. While it has been shown to enhance inter-layer load transfer—and hence reduce interlaminar shear—it is also known to be extremely damaging to the surrounding fabric or plies. For this reason, Z-Pinning is applied sparingly and only to those regions at risk of delamination. Thus, the fiber volume fraction represented by Z-Pins seldom exceeds 1% in traditional composites. The 3-D fiber architectures proposed herein, particularly in FIGS. 22A-24C, in contrast, deliver up to 19.6% and 22.7% Z-Pin (i.e. fiber forest) fiber volume fraction for square and hex respectively, essentially for free, and without any damage to the cross-plies. It is therefore legitimate to expect enhanced interlayer load transfer and interlaminar shear strength.

In addition to structural advantages, the high density fiber forest potentially presents significant cross-thickness heat transfer benefits. The microstructure of SiC fibers from the forest, exhibit a non-uniform microstructure, with elongated grains at the center becoming equiaxed nanocrystalline outward. Existing literature on similar B—SiC microstructures points to an anisotropic conductivity being 15% higher along the fiber's axis, as compared to the radial direction. The fiber forest therefore enhances thermal conductivity across the thickness by ~3% compared to composite without the fiber forest. Small as it is, this is an additional 3% over the much greater benefit afforded by a reduced thickness; that in itself reduces thermal resistance by a factor 2-3, the conductivity across a composite shell may well improve by a minimum factor of 2.0-3.1 compared to a braided or woven commercial SiCf tow of equal strength. This is a minimum because it does not account for the added thermal resistance measured by a number of researchers in CMCs made with tows as a result of intra-tow and intra-weave voids leftover by incomplete matrix infiltration. Such voids are a common and well documented issue with CMCs reinforced with SiCf tows. They result from closed intra-tow and intra-weave porosities that are inaccessible to chemical vapor infiltration (CVI) of the matrix. In contrast, note that the fiber architectures of FIGS. 22A-24B cannot exhibit closed porosity. The square and hex architecture both leave a network of interconnected open porosity that should remove obstacles to full density CVI of the matrix.

In contrast to state of the art commercial SiCf tow fabrics, the disclosed approach essentially obviates the need for weaving, braiding, or knitting, in favor of a microscale equivalent of a rebar trellis. The present invention is therefore in one aspect a non-woven "micro-trellis" (µ-trellis) fabrics illustrated in FIGS. 22A-24B. Such a fabric would avail CMC manufacturing to existing composite layup technology, further cutting CMC fabrication costs. Even more embodiments are possible. One such embodiment would be to pre-fill the voids in between fibers with highly crystalline B-SiC particulates or whiskers thus drastically reducing the duration and cost of the CVI process and/or opening up other densification processes (e.g. FAST).

Sensor Implementations—e.g., Thermopile

Figure 25A:
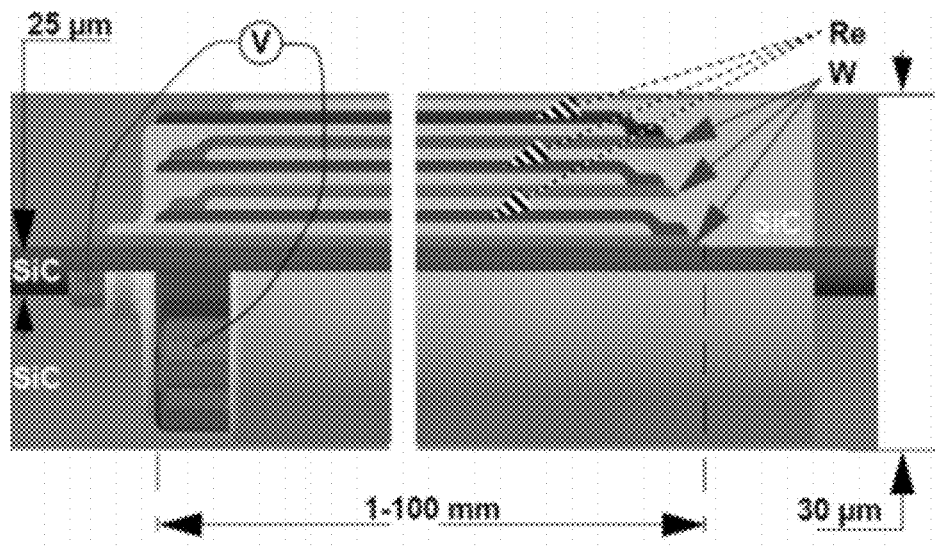
FIG. 25A shows an anamorphosed cross-sectional view of a micro-embedded high-temperature W—Re thermopile, in accordance with one or more aspects of the present invention.

FIG. 25A shows an anamorphosed cross-sectional view of a micro-embedded high-temperature W—Re thermopile.

This sensor design builds upon the technology stack claimed in U.S. Patent Publication No. 2017/0331022 A1, which published Nov. 16, 2017, entitled "Multilayer Functional Fiber and Method of Making"; PCT Publication No. WO 2017/197105 A1, which published Nov. 16, 2017. It is illustrated by FIG. 25.

The outer 2.5 µm of the radius is magnified 33× relative to the 25 µm scaffold SiC fiber, whereas axial dimensions are shrunk ~300 fold. With only one junction, this structure forms a high-temperature thermocouple. With multiple junctions, it forms a thermally-driven power supply that can be used to power wireless interrogation of micro-embedded sensors. The red and blue "wires" indicate the power source/thermocouple.

Figure 25B:
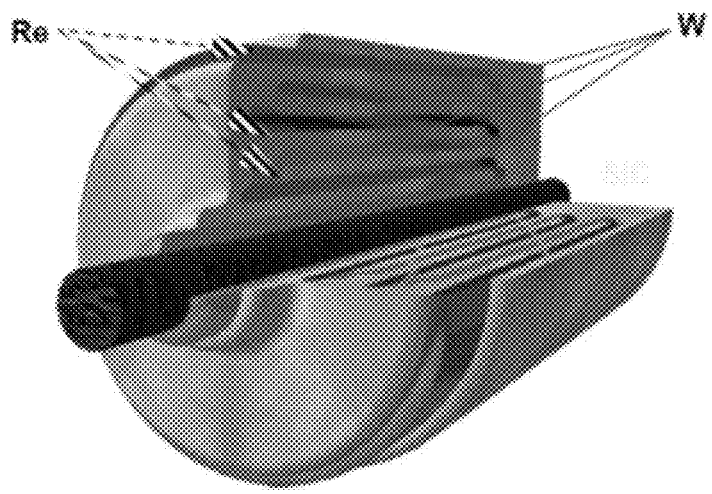
FIG. 25B is a perspective view of the thermopile of FIG. 25A, with a similar anamorphose and outer 2.5 μm of embedding removed for clarity, in accordance with one or more aspects of the present invention.

FIG. 25B is a perspective view of the thermopile of FIG. 25A, with a similar anamorphose and outer 2.5 μm of embedding removed for clarity.

In accordance with the present invention, fibers that are usually only thought of as structural or thermostructural reinforcement in ceramic or carbon matrix composites can also host embedded microsensors, or more generally microsystems. The strategy to embed such microdevices is known as "Spot-coating". Large arrays of fiber-integrated sensors embedded in a composite matrix can measure fields of temperature, strain, and so forth in the composite, thereby continuously monitoring the state of function deep within the composite. Moreover, with the evolution of such reading with time (so called "4-D sensing"), changes in local reading can inform detection and monitoring of defect propagation. One analogy in biology would be a nervous system.

The embodiment of FIGS. 25A-25B is only an example to illustrate the wide range of embedded microdevices that are feasible. In its simplest expression, where only one layer of each metal is applied as coating, thermocouple pairs are enabled such as W—Re, W—Mo, W—Nb, or Mo—Nb. Other high temperature thermocouple pairs applicable in lieu of the aforementioned metal pairs include for example conductive diboride or oxide based pairs (e.g. HfB2/TaB2 or ZnO/In2O3).

In a broad sense, the thermocouple disclosed can be a bimetallic pair in contact at one end. In this instance, the pair is made of concentric metallic microtubes deposited within the fiber structure. At its most general, multiple layers of alternating metal pairs can be overlaid, with alternating junctions at each end. This more general version is typically used as a thermopile and is used for thermoelectric power generation.

In accordance with the present invention, such microsensors can be formed as standalone sensors for targeted purposes, and/or embedded into and/or assembled as part of, the fabrics discussed above to form an integral part of the fabric's function.

The functional layer of the sensor may comprise a conductive layer joined at one end to a second different conductive separated by an insulating layer, in such a way that the junction forms a thermocouple pair according to the Seebeck effect.

In addition, multiple thermocouple pairs can be superimposed and connected in series to form a thermopile according to the Seebeck and Thompson effects.

The fabrics disclosed herein may be formed by any of the methods disclosed herein, in accordance with one or more aspects of the present invention.

Integral Attachment with Micro-Trellis

Figure 26A:
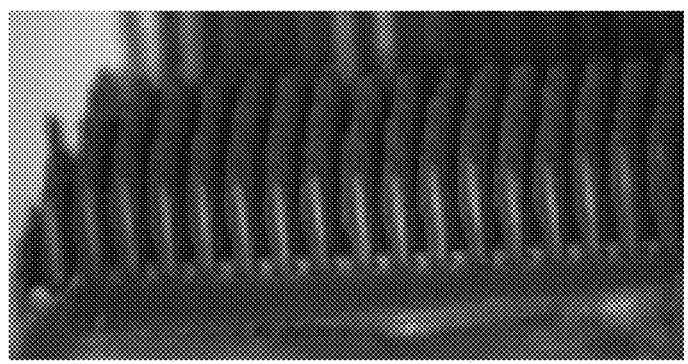
FIG. 26A depicts a square array of silicon carbide standing fibers grown off a Zirconium substrate, in accordance with one or more aspects of the present invention.
Figure 26B:
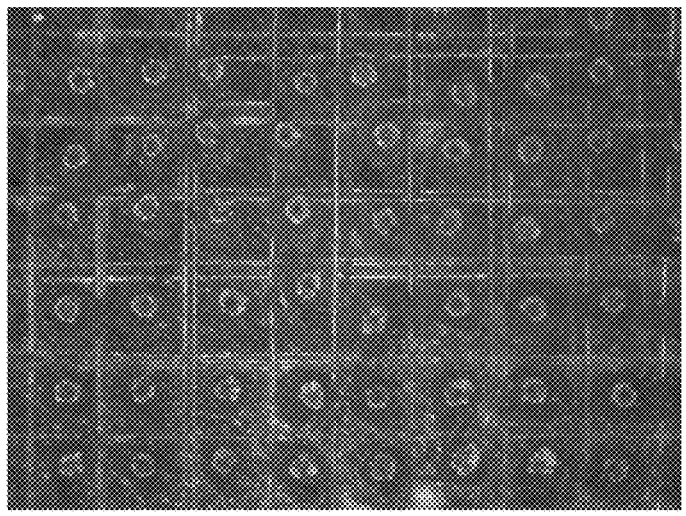
FIG. 26B is a top view of a square lattice micro-trellis of the structure of FIG. 26A, with the silicon carbide fibers running in fiber layers at 0-90 degree orientations, in accordance with one or more aspects of the present invention.
Figure 26C:
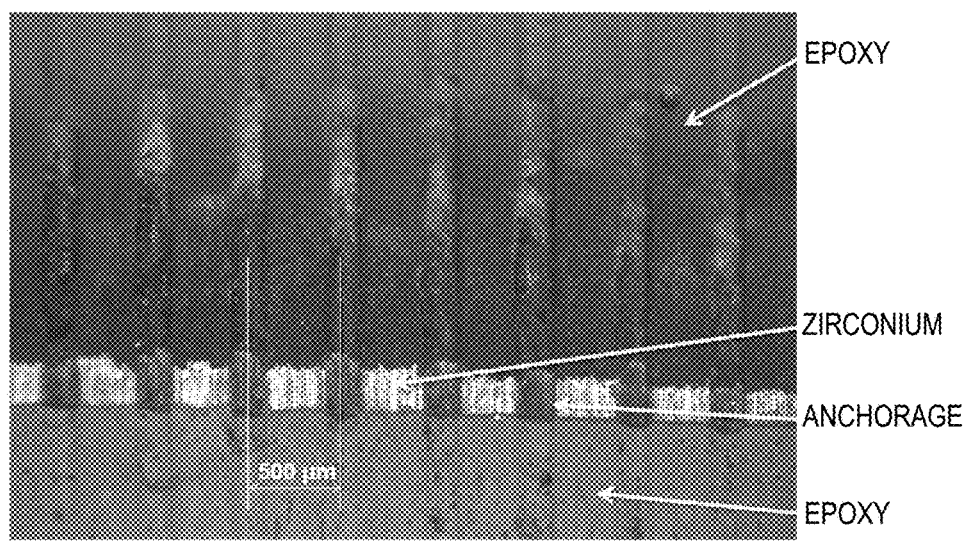
FIG. 26C is a cross-sectional view of the structure of FIG. 26B, shown through a row of standing fibers and illustrating the implantation into the zirconium metal, in accordance with one or more aspects of the present invention.

The micro-trellis fiber architecture is not limited to structural reinforcement. Implanting standing or short fibers arrays on a carbon substrate, as shown in FIG. 20A, a ceramic matrix composite, as shown in FIG. 21, or a metal surface, as shown in FIG. 26A, provides means of integral attachment with a micro-trellis reinforced composite material. This is illustrated by FIG. 26B where laser-printed silicon carbide fiber layers are inserted at 0-90° orientations in the plane perpendicular to the standing or short fiber array, and a matrix is subsequently infiltrated. The result is an integral hybrid composite in which the substrate used to grow the short fiber array becomes permanently attached to the micro-trellis reinforced composite built upon it. FIG. 26C shows that the standing fibers are implanted into the metal base. Note that in FIG. 26C, epoxy is present as an embedding medium to allow cross-sectioning of the fiber architecture, and is not part of the final structure.

More particularly, in order to produce a hybrid composite where a metal base is attached to a ceramic matrix composite, for example, a high-density array of freestanding fibers is grown by LCVD over the metal base. Process parameters are adjusted in such a way that the freestanding fibers are actually rooted in the base metal, thus providing a sturdy mechanical attachment. This is illustrated by FIG. 26A, which shows a high density square array of silicon carbide fibers grown by LCVD over a Zirconium foil, with laser process parameters such as the root of the freestanding fibers extend into the tantalum, forming a transition from metal base to freestanding ceramic fibers.

Fibers arranged in ribbons (such as those shown in FIG. 19), arranged in non-woven mats, or in a combination thereof, are then laid down interspersed with the array of freestanding fibers, resulting in a microtrellis structure. The result of such assemblage is seen in FIG. 26B, looking down at the freestanding fiber array, with continuous silicon carbide fibers at 90° from each other, and running along the spaces in between rows of freestanding fibers. The result is a square lattice microtrellis. Infiltrating a matrix, such as silicon carbide, via CVD/CVI or Preceramic Polymer Infiltration, for example, thus produces a ceramic matrix composite shell with integral attachment to the metal base. For the purpose of clarity in FIG. 26B, the silicon carbide matrix is substituted with a clear epoxy that shows some of the continuous fibers running perpendicular to the freestanding array.

To investigate the nature of the roots of freestanding ceramic fibers into the metal base, the sample in FIG. 26B was sectioned along a row of freestanding fibers. The root was analyzed to show the gradual transition from the base metal into the freestanding ceramic fiber. This root or anchorage of the freestanding fibers into the zirconium metal base is evident in FIG. 26C, which clearly shows the base of the freestanding fibers in cross-section. The attachment strength was measured for its shear properties to confirm the anchorage.

Figure 27:
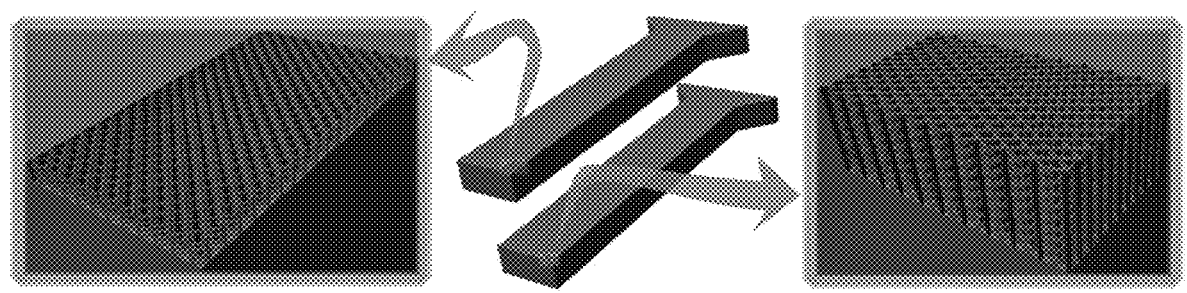
FIG. 27 illustrates two versions of externally identical ceramic matrix components, one reinforced with a square lattice micro-trellis, the other with a hex lattice, in accordance with one or more aspects of the present invention.

At their simplest, micro-trellis can be used to customize reinforcement of composite materials using non-woven fiber architecture and orientation. FIG. 27, for example shows two sample composite fasteners, which look externally identical. However, a close examination of the micro-trellis fiber reinforcement shows their difference in architecture and orientation. FIG. 27 shows that one can achieve two families of composite structures depending on the fiber architecture and orientation. Magnified corners of the Quad and Hex 3-D fiber architectures are shown respectively on the left and right of FIG. 27 with the matrix removed. These new composites exhibit a genuine 3-D fiber architecture, which protects against delamination failure. Compared to 3-D braiding or weaving, which are known to impart severe damage to tows and leave intra-tow and intra-weave voids, 3-D micro-trellises preserve the native properties of the fibers and are inherently openly porous structures that lend themselves to infiltration. These advantages are amplified by laser-printed SiC fibers since they were shown to significantly outperform polymer-derived SiC fiber tows in high temperature strength, creep and oxidation resistance.

Figure 28:
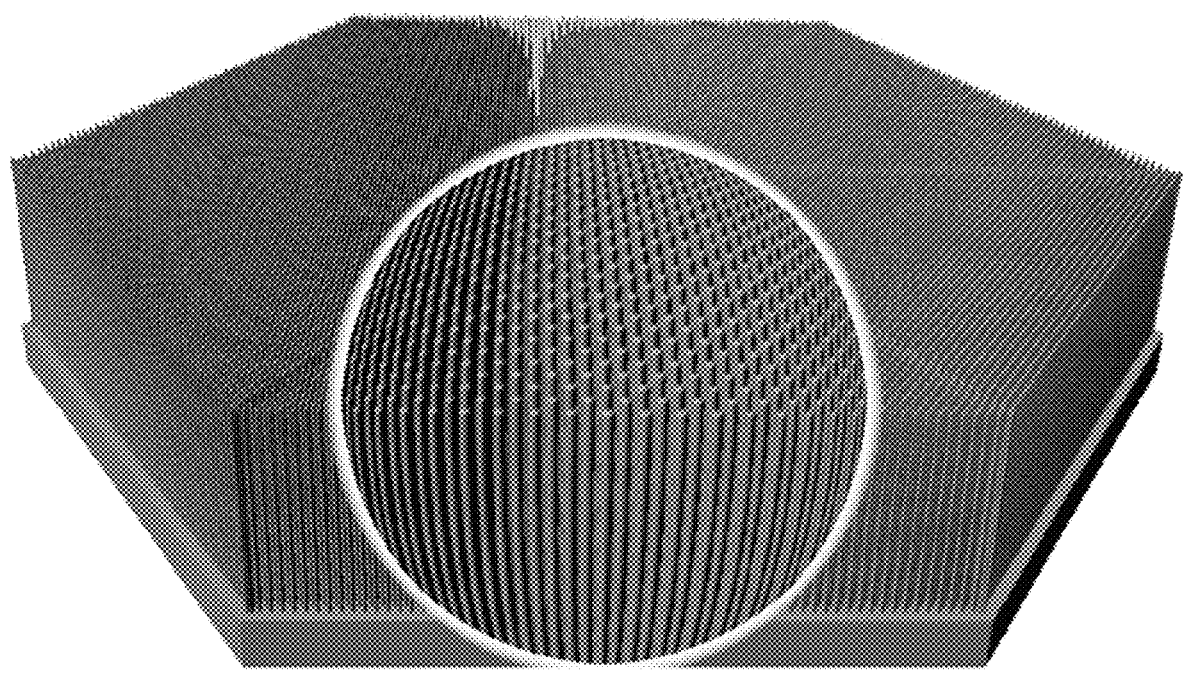
FIG. 28 is a sample hexagonal array fiber forest protruding from a ceramic matrix composite or carbon-carbon composite intended for metal infiltration, in accordance with one or more aspects of the present invention.

Finally, instead of building a micro-trellis composite atop a base metal, one can also take advantage of the micro-trellis architecture to deposit a metal onto a ceramic matrix composite, thus achieving joining in yet another way. FIG. 28, for example, shows how a hexagonal array of short fibers can be left protruding out of a composite material base for subsequent infiltration or deposition of a metal (e.g., a liquid metal).

Figure 29:
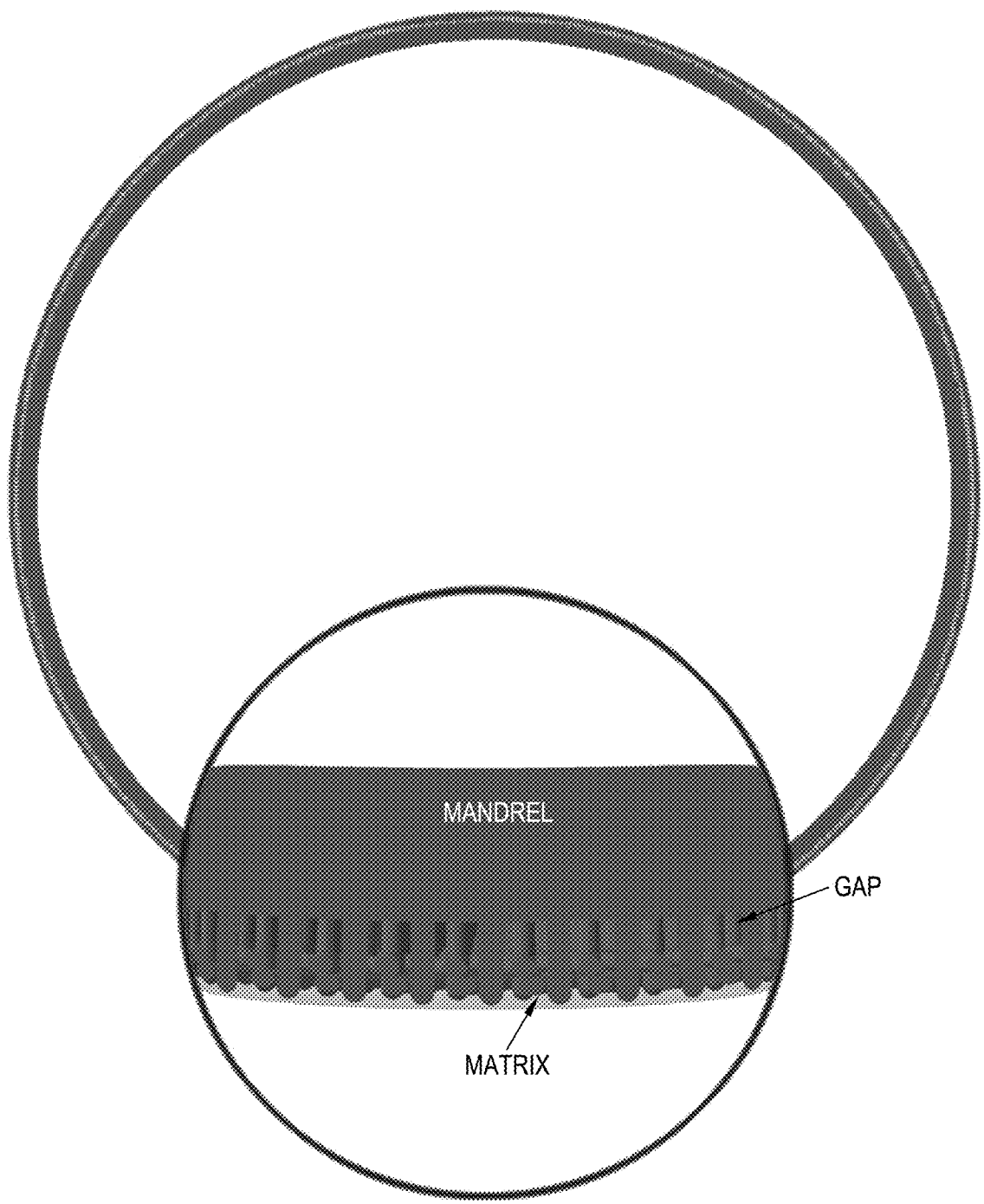
FIG. 29 shows an end-view of a hybrid composite similar to that of FIG. 17, but with a gap left between the ceramic matrix composite shell and the mandrel, the mandrel and ceramic matrix composite being held together by the forest of radial spikes protruding from the mandrel, in accordance with one or more aspects of the present invention.

Joining between a base substrate and the micro-trellis reinforced ceramic matrix composite is also achieved when leaving a gap. A sample structure derived from FIG. 17 is shown in FIG. 29. It shows an end view of the mandrel with a layer of composite material separated by a gap, as per magnified inset. The ceramic matrix composite outer shell and the mandrel are held together by the very large array of spikes protruding from the mandrel. Leaving such a gap can provide many benefits. For example, the spikes can be regarded as elastic links to compensate differences in thermal expansion between the mandrel and the composite and prevent delamination. The gap can also be used as a cooling channel for a coolant fluid. In this case, the spikes, in addition to being structural ties, also act as fins to enhance heat exchanges with the fluid.

Those skilled in the art will note that numerous inventive aspects and features are disclosed herein, and unless inconsistent, each disclosed aspect or feature is combinable with any other disclosed aspect or feature as desired for a particular application, as disclosed herein. Provided is a small sampling of embodiments of the present invention, as described herein:

A1. A non-woven fabric including: a three-dimensional array of fibers, where at least a portion of the three-dimensional array of fibers includes: an array of standing fibers extending perpendicular to a plane of the non-woven fabric and extending to a base substrate, the base substrate being at least one of an expendable film substrate, a metal base substrate, or a mandrel substrate; and multiple layers of non-woven parallel fibers running parallel to the plane of the non-woven fabric in between the array of standing fibers in a defined pattern of fiber layer orientations.

A2. The non-woven fabric of A1, wherein the array of standing fibers comprises a square array of standing fibers extending perpendicular to the plane of the non-woven fabric, and the defined pattern of fiber layer orientations includes a 0-90 orientation pattern of layers.

A3. The non-woven fabric of A1 or A2, wherein the array of standing fibers comprises a hexagonal array of standing fibers extending perpendicular to the plane of the non-woven fabric, and the defined pattern of fiber layer orientations includes a 0-60-120 orientation pattern of layers.

A4. The non-woven fabric of A1, A2, or A3, wherein: the array of standing fibers comprises an ordinarily solid material selected from a group consisting of boron, carbon, aluminum, silicon, titanium, zirconium, niobium, molybdenum, hafnium, tantalum, tungsten, rhenium, yttrium, osmium, uranium, thorium, plutonium, nitrogen, oxygen, and combinations thereof; and/or the multiple layers of non-woven parallel fibers running parallel to the plane of the fabric comprise an ordinarily solid material selected from a group consisting of boron, carbon, aluminum, silicon, titanium, zirconium, niobium, molybdenum, hafnium, tantalum, tungsten, rhenium, yttrium, osmium, uranium, thorium, plutonium, nitrogen, oxygen, and combinations thereof.

A5. The non-woven fabric of A1, A2, A3 or A4, wherein fibers running in different directions of the non-woven parallel fibers running parallel to the plane of the non-woven fabric are of different constitutive material, and fibers in different layers of the multiple layers of non-woven parallel fibers running parallel to the plane of the non-woven fabric are of different constitutive material, and are of different constitutive material from fibers of the array of standing fibers extending perpendicular to the plane of the non-woven fabric.

A6. The non-woven fabric of A1, A2, A3, A4 or A5, wherein the array of standing fibers are grown to extend from the base substrate using laser-assisted chemical vapor deposition (LCVD).

A7. The non-woven fabric of A1, A2, A3, A4, A5 or A6, in combination with a composite material structure, in which a matrix of the composite material structure is reinforced with the non-woven fabric, the matrix being composed of an ordinarily solid material selected from a group consisting of boron, carbon, aluminum, silicon, titanium, zirconium, niobium, molybdenum, hafnium, tantalum, tungsten, rhenium, yttrium, osmium, uranium, thorium, plutonium, nitrogen, oxygen, and combinations thereof.

A8. The combination of A7, in which standing fibers of the array of standing fibers extending perpendicular to the plane of the non-woven fabric are anchored into a metal base substrate, and form a hybrid-composite with the metal base substrate integrally joined to the composite material structure.

A9. The combination A7 or A8, in which a gap is left between the metal base substrate and the multiple layers of non-woven parallel fibers running parallel to the plane of the non-woven fabric in between the array of standing fibers.

A10. The combination of A9, wherein the gap defines or includes a cooling channel.

A11. The combination of A9 or A10, wherein standing fibers of the array of standing fibers in the gap operate as elastic beams that compensate for differences in thermal expansion between the metal base substrate and the multiple layers of non-woven parallel fibers.

B1. A three-dimensional fabric including an array of fibers that do not interlace or interweave with each other to preserve fiber strength. The array of fibers including: an array of standing fibers extending a thickness of the three-dimensional fabric or more, and grown off (i) a thin layer of expendable material, (ii) a layer that is part of the three-dimensional fabric, or (iii) a mandrel to directly form a finished CMC shell. Further, the array of fibers includes at least one layer of parallel fibers running parallel to a plane of the three-dimensional fabric in between standing fibers of the array of standing fibers.

B2. The three-dimensional fabric of B1, wherein the at least one layer of fibers running parallel to the plane of the three-dimensional fabric is one fiber layer thick.

B3. The three-dimensional fabric of B1 or B2, wherein the array of standing fibers are grown using laser-assisted chemical vapor deposition (LCVD).

C1. A method which includes forming a non-woven fabric comprising a three-dimensional array of fibers. The forming includes: forming an array of standing fibers extending perpendicular to a plane of the non-woven fabric and attached to a base substrate, the base substrate being at least one of an expendable film substrate, a metal base substrate, or a mandrel substrate; and providing multiple layers of non-woven parallel fibers in between standing fibers of the array of standing fibers and running parallel to the plane of the non-woven fabric in a defined pattern of fiber layer orientations.

C2. The method of C1, wherein the array of standing fibers comprises a square array of standing fibers extending perpendicular to the plane of the non-woven fabric, and the defined pattern of fiber layer orientations includes a 0-90 orientation pattern of layers.

C3. The method of C1 or C2, wherein the array of standing fibers comprises a hexagonal array of standing fibers extending perpendicular to the plane of the non-woven fabric, and the defined pattern of fiber layer orientations includes a 0-60-120 orientation pattern of layers.

C4. The method of C1, C2 or C3, wherein forming the array of standing fibers extending perpendicular to the plane of the non-woven fabric comprises growing the array of standing fibers to extend from the base substrate perpendicular to the plane of the non-woven fabric.

C5. The method of C4, wherein growing the array of standing fibers includes using laser-assisted chemical vapor deposition (LCVD) in growing the array of standing fibers to extend from the base structure, and wherein the base structure comprises one of the metal base substrate or the mandrel substrate, the growing resulting in integrally joining the array of standing fibers to the base substrate.

C6. The method of C1, C2, C3, C4 or C5, wherein providing the multiple layers of non-woven parallel fibers in between the standing fibers of the array of standing fibers includes leaving a gap between the base substrate and the multiple layers of non-woven parallel fibers, C7. The method of C6, wherein providing the gap comprises sizing the gap to define a cooling channel between the base substrate and the multiple layers of non-woven parallel fibers, C8. The method of C6 or C7, wherein forming the array of standing fibers attached to the base substrate comprises selecting a constitutive material for the array of standing fibers so that standing fibers of the array of standing fibers in the gap operate as elastic beams that compensate for differences in thermal expansion between the base substrate and the multiple layers of non-woven parallel fibers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

REFERENCES

1. C. Droillard, J. Lamon, J. Am. Ceram. Soc. 79 [4] 849-858 (1996).
2. S. Bertrand, C. Droillard, R. Pailler, X. Bourrat, R. Naslain, J. Eur. Ceram. Soc. 20 1-13 (2000).
3. Droillard, C., Lamon, J. and Bourrat, X., Mat. Res. Soc. Proc., 365, 371-376 (1995).
4. R. Naslain, J. Lamon, R. Pailler, X. Bourrat, A. Guette, F. Langlais, Composites part A—Applied science and manufacturing, 30, p. 537 (1999).
5. H. Wua, M. Chena, X. Wei, M. Ge, W. Zhang, Appl. Surf. Sc. 257 1276-1281 (2010).
6. Carpenter, An Assessment of Silicon Carbide as a cladding material for light water reactors. Ph. D. thesis, Massachusetts Institute of Technology (2011).
7. Feinroth, H.; Mechanical Strength of CTP TRIPLEX SiC Fuel Clad Tubes after Irradiation in MIT Research Reactor Under PWR Coolant Conditions. 33rd International Conference on Advanced Ceramics & Composites (2009).
8. M. Zabiégo, C. Sauder, C. Lorrette, and P. Guedeney, Tube multicouche amélioré en matériau composite à matrice céramique, gaine de combustible nucléaire en résultant et procédés de fabrication associés, French Patent 2 978 697 al; (2013).
9. Duquesne, L.; "Caractérisation thermique de structures composites SiCf/SiC tubulaires pour applications nucléaires. Génie des procédés", Ecole nationale supérieure d'arts et métiers—ENSAM (2015).
10. H. A. Bale, A. Haboub, A. A. MacDowell, J. R. Nasiatka, D. L. Parkinson, B. N. Cox, D. B. Marshall and R. O. Ritchie, "Real-Time Quantitative Imaging of Failure Events in Materials under Load at Temperatures above 1600° C.", Nature Materials, vol. 12 (1), January 2013, pp. 40-46.
11. Pegna, J., Schneiter, J. L., Williams, K. L. and Goduguchinta, R., U.S. patent Ser. No. 10/047,015B2 (Aug. 14, 2018).
12. Maxwell, J. L.; Pegna, J.; DeAngelis, D. A.; Messia, D. V. "Three-dimensional laser chemical vapor deposition of nickel-iron alloys," Advanced Laser Processing of Materials—Fundamentals and Applications. MRS (1996) pp 601-606.
13. Patel, D. R, and Koyanagi, T.; ANS 2019 Manuscript. (Private communication with the authors).
14. Morscher, G. N. et al.; J. Am. Ceram. Soc. 78 12, 3244 (2005); https://doi.org/10.1111/j.1151-2916.1995.tb07960.x
15. DiCarlo, J. A.; Compos. Sci. Technol. 51 2, 213 (1994); https://doi.org/10.1016/0266-3538(94)90191-0.
16. Harrison, S. L., Pegna, J., Schneiter, J. L., Vaaler, E. G., Williams, K. L., Goduguchinta, R. K.; Single Fiber Creep Performance at 1500 C for Silicon Carbide Fiber Materials, 43rd International Conference on Advanced Ceramics & Composites (2019).
17. Ghoniem, N. M.; Journal of Nuclear Materials 191-194 (1992) 515-519.
18. Bansal, N. P. and Setlock, J. A., Composites: Part A, 32 (2001) 1021-1029.
19. Zhang, G-J., Deng, Z-Y., Kondo, N., Yang, J-F., and Ohji, T.; J. Am. Ceram. Soc., 83 [9] 2330-32 (2000).

20. Goela, J. S., Brese, N. E., Burns, L. E. and Pickering, M. A.; 9th International Conference on Advanced Thermal Processing of Semiconductors, RTP, 2001, pp. 217-224.
21. Perez-Bergquist, A. G, Nozawa, T., Shih, C., Leonard, K. J., Snead, L. L. and Katoh, Y.; Journal of Nuclear Materials 462 (2015) 443-449; http://dx.doi.org/10.1016/j.jnucmat.2014.06.038.
22. Katoh, Y., Nozawa, T., Shih, C., Ozawa, K., Koyanagi, T., Porter, W. and Snead, L. L.; Journal of Nuclear Materials 462 (2015) 450-457; http://dx.doi.org/10.1016/j.jnucmat.2014.12.121.
23. Koyanagi, T. and Katoh, Y.; Journal of Nuclear Materials 494 (2017) 46-54; http://dx.doi.org/10.1016/j.jnucmat.2017.07.007.
24. Koyanagia, T., Nozawab, T., Katoh, Y. and Snead, L. L.; Journal of the European Ceramic Society 38 (2018) 1087-1094; http://dx.doi.org/10.1016/j.jeurceramsoc.2017.12.026.
25. Majid, A.; Ceramics International 44 (2018) 1277-1283; http://dx.doi.org/10.1016/j.ceramint.2017.10.165.
26. Snead, L. L., Nozawa, T., Katoh, Y., Byun, T.-S., Kondo, S., and Petti, D. A.; Journal of Nuclear Materials 371 (2007) 329-377; doi:10.1016/j.jnucmat.2007.05.016.
27. Bale, H. A., Haboub, A., MacDowell, A. A., Nasiatka, J. R., Parkinson, D. Y., Cox, B. N., Marshall, D. B. and Ritchie, R. O.; Nature Materials (12) January 2013, 40-46; DOI: 10.1038/NMAT3497.

What is claimed is:

1. A structure comprising:
    a non-woven fabric, the non-woven fabric including a three-dimensional array of fibers comprising:
        a fiber forest comprising a two-dimensional array of standing fibers of equal height extending within the non-woven fabric perpendicular to a surface of the non-woven fabric;
        multiple layers of non-woven discrete fibers within the non-woven fabric running parallel to the surface of the non-woven fabric in between the array of standing fibers in a defined pattern of fiber layer orientations, wherein fibers of the multiple layers of non-woven discrete fibers running parallel to the surface of the non-woven fabric are laser chemical vapor deposition (LCVD) formed fibers; and
        wherein standing fibers of the array of standing fibers of equal height extending perpendicular to the surface of the non-woven fabric are anchored into a metal base substrate, and form a hybrid-composite with the metal base substrate integrally joined by the standing fibers to a composite material structure comprising a matrix material surrounding the multiple layers of non-woven discrete fibers within the non-woven fabric.

2. The structure of claim 1, further comprising a cooling gap defined by a space between the metal base substrate and the composite material structure with the multiple layers of non-woven discrete fibers running parallel to the surface of the non-woven fabric in between the array of standing fibers of equal height.

3. The structure of claim 2, wherein the cooling gap comprises a cooling channel disposed between the metal base substrate and the composite material structure with the multiple layers of non-woven discrete fibers running parallel to the surface of the non-woven fabric.

4. The structure of claim 2, wherein standing fibers of the array of standing fibers of equal height in the cooling gap operate as elastic beams that compensate for differences in thermal expansion between the metal base substrate and the composite material structure with the multiple layers of non-woven discrete fibers.

* * * * *